US009986669B2

(12) United States Patent
Uprety et al.

(10) Patent No.: US 9,986,669 B2
(45) Date of Patent: May 29, 2018

(54) TRANSPARENCY INCLUDING CONDUCTIVE MESH INCLUDING A CLOSED SHAPE HAVING AT LEAST ONE CURVED SIDE

(71) Applicant: PPG INDUSTRIES OHIO, INC., Cleveland, OH (US)

(72) Inventors: Krishna K. Uprety, Valencia, CA (US); Alexander Bimanand, Burbank, CA (US); Khushroo H. Lakdawala, Chatsworth, CA (US)

(73) Assignee: PPG INDUSTRIES OHIO, INC., Cleveland, OH (US)

( * ) Notice: Subject to any disclaimer, the term of this patent is extended or adjusted under 35 U.S.C. 154(b) by 0 days. days.

(21) Appl. No.: 15/009,630

(22) Filed: Jan. 28, 2016

(65) Prior Publication Data
US 2017/0150659 A1   May 25, 2017

Related U.S. Application Data

(60) Provisional application No. 62/260,151, filed on Nov. 25, 2015.

(51) Int. Cl.
*H05K 9/00* (2006.01)
*C03C 17/36* (2006.01)
(Continued)

(52) U.S. Cl.
CPC ......... *H05K 9/0094* (2013.01); *B64C 1/1476* (2013.01); *C03C 17/06* (2013.01);
(Continued)

(58) Field of Classification Search
None
See application file for complete search history.

(56) References Cited

U.S. PATENT DOCUMENTS 3,773,514 A  * 11/1973  Fromson ............... H05K 3/048
                                                  101/467
3,775,157 A  * 11/1973  Fromson ............... G03F 7/016
                                                  205/187
(Continued)

FOREIGN PATENT DOCUMENTS

CN       101610948 A      12/2009
CN       102311729 A       1/2012
(Continued)

OTHER PUBLICATIONS

Chinese Office Action dated Aug. 28, 2015 of the corresponding Chinese Patent Application No. 201280071821.3, noting listed references in this IDS, (22 pages).

(Continued)

*Primary Examiner* — Timothy Thompson
*Assistant Examiner* — Muhammed Azam
(74) *Attorney, Agent, or Firm* — Lewis Roca Rothgerber Christie LLP

(57) ABSTRACT

A transparency includes a transparent substrate and a plurality of electrically conductive lines on the transparent substrate, at least one of the electrically conductive lines intersecting at least one other electrically conductive line, and at least one of the electrically conductive lines having a width of no more than 50 μm to reduce distraction resulting from optical diffraction of light transmitted through or reflected by the transparency as compared to a transparency comprising electrically conductive lines having a width greater than 50 μm. A coated substrate includes: a substrate; a dielectric layer on the substrate; and a sensor including a conductive layer on the dielectric layer, where at least one layer selected from the dielectric layer and the conductive layer is formed by at least one method selected from lithography, inkjet printing, and aerosol jet printing.

20 Claims, 25 Drawing Sheets

(51) Int. Cl.
  *H05K 1/02*    (2006.01)
  *C03C 17/38*   (2006.01)
  *H05K 1/18*    (2006.01)
  *C03C 17/06*   (2006.01)
  *B64C 1/14*    (2006.01)

(52) U.S. Cl.
  CPC .......... *C03C 17/36* (2013.01); *C03C 17/3673* (2013.01); *C03C 17/3676* (2013.01); *C03C 17/38* (2013.01); *H05K 1/0212* (2013.01); *H05K 1/0216* (2013.01); *H05K 1/18* (2013.01); *C03C 2217/94* (2013.01)

(56) References Cited

U.S. PATENT DOCUMENTS

| | | | |
|---|---|---|---|
| 4,128,448 A | 12/1978 | Bitterice et al. | |
| 4,211,910 A * | 7/1980 | Kusunoki | H05B 6/766 174/359 |
| 4,338,000 A * | 7/1982 | Kamimori | B32B 17/10036 252/600 |
| 4,410,872 A * | 10/1983 | Stecher | G01K 7/223 338/114 |
| 4,652,090 A * | 3/1987 | Uchikawa | G02F 1/1527 359/267 |
| 4,671,619 A * | 6/1987 | Kamimori | G02F 1/1525 359/275 |
| 4,768,865 A * | 9/1988 | Greenberg | G02F 1/155 359/266 |
| 4,859,532 A | 8/1989 | Oyama et al. | |
| 4,932,755 A | 6/1990 | Holdridge et al. | |
| 5,066,111 A * | 11/1991 | Singleton | G02F 1/1525 359/245 |
| 5,071,206 A | 12/1991 | Hood et al. | |
| 5,142,407 A * | 8/1992 | Varaprasad | C09K 9/02 359/265 |
| 5,359,149 A * | 10/1994 | Seike | H01L 39/02 174/125.1 |
| 5,472,643 A * | 12/1995 | Varaprasad | C09K 9/02 252/583 |
| 5,525,401 A | 6/1996 | Hirmer | |
| 5,668,663 A * | 9/1997 | Varaprasad | B32B 17/06 359/265 |
| 5,724,176 A * | 3/1998 | Nishikitani | G02F 1/155 359/269 |
| 5,986,613 A * | 11/1999 | Weber | B60S 1/026 174/94 R |
| 6,030,708 A * | 2/2000 | Ishibashi | H05K 9/0096 427/108 |
| 6,317,248 B1 * | 11/2001 | Agrawal | G02F 1/155 340/438 |
| 6,594,067 B2 * | 7/2003 | Poll | E06B 3/66 359/265 |
| 6,906,842 B2 * | 6/2005 | Agrawal | G02F 1/1523 359/265 |
| 7,256,923 B2 | 8/2007 | Liu et al. | |
| 7,450,294 B2 * | 11/2008 | Weidner | B64C 1/1484 359/265 |
| 7,688,495 B2 * | 3/2010 | Tonar | B60R 1/084 359/245 |
| 7,824,580 B2 | 11/2010 | Boll et al. | |
| 8,115,984 B2 * | 2/2012 | Agrawal | B82Y 20/00 359/265 |
| 8,425,792 B2 * | 4/2013 | Zu | B82Y 10/00 216/11 |
| 8,618,013 B2 * | 12/2013 | Finley | B22F 1/0018 252/500 |
| 8,637,169 B2 | 1/2014 | Van Nutt et al. | |
| 8,692,283 B2 * | 4/2014 | Nakanishi | H01L 51/5209 174/126.2 |
| 8,988,757 B2 * | 3/2015 | Weidner | B64C 1/1484 359/265 |
| 9,140,832 B2 * | 9/2015 | Medwick | G02B 5/0858 |
| 9,300,036 B2 * | 3/2016 | Misra | H01Q 1/42 |
| 9,320,136 B2 * | 4/2016 | Frey | H05K 1/0274 |
| 2003/0013048 A1 * | 1/2003 | Gilson | H05K 9/0096 430/321 |
| 2003/0121272 A1 * | 7/2003 | Kim | F25D 29/00 62/125 |
| 2003/0124259 A1 | 7/2003 | Kodas et al. | |
| 2003/0127445 A1 * | 7/2003 | Oguma | G02B 6/12026 219/209 |
| 2003/0136572 A1 * | 7/2003 | Arakawa | B32B 15/08 174/389 |
| 2005/0095410 A1 * | 5/2005 | Mazurkiewicz | H01L 23/552 428/209 |
| 2005/0111070 A1 | 5/2005 | Lin et al. | |
| 2006/0038478 A1 * | 2/2006 | Moon | B32B 7/12 313/492 |
| 2006/0048963 A1 * | 3/2006 | Nishinaka | B32B 7/12 174/393 |
| 2006/0097650 A1 * | 5/2006 | Kim | H01J 11/12 315/169.4 |
| 2006/0099403 A1 * | 5/2006 | Johnson | H01L 23/3733 428/323 |
| 2006/0121271 A1 * | 6/2006 | Frey | C23C 18/1608 428/333 |
| 2006/0137856 A1 * | 6/2006 | Popovich | F28F 1/122 165/80.4 |
| 2006/0154092 A1 * | 7/2006 | Naito | B32B 15/04 428/457 |
| 2006/0183342 A1 * | 8/2006 | Bruyns | H05K 3/02 438/768 |
| 2006/0186104 A1 * | 8/2006 | Winter | H05B 3/84 219/203 |
| 2006/0200965 A1 * | 9/2006 | Farooq | B23K 1/018 29/426.3 |
| 2007/0018576 A1 * | 1/2007 | Park | H01J 11/10 313/582 |
| 2007/0128905 A1 * | 6/2007 | Speakman | H05K 1/0265 439/161 |
| 2007/0201122 A1 | 8/2007 | Dozeman et al. | |
| 2008/0042012 A1 | 2/2008 | Callahan et al. | |
| 2008/0047747 A1 * | 2/2008 | Aoyama | H05K 9/0096 174/389 |
| 2008/0057233 A1 * | 3/2008 | Harrison | B41M 5/3825 428/32.74 |
| 2008/0143913 A1 * | 6/2008 | Lee | G02F 1/13452 349/54 |
| 2008/0144159 A1 | 6/2008 | Nerden | |
| 2008/0150148 A1 * | 6/2008 | Frey | C23C 18/1608 257/769 |
| 2008/0197773 A1 * | 8/2008 | Cha | H01J 11/12 313/582 |
| 2008/0204970 A1 * | 8/2008 | Ocola | H01G 4/008 361/305 |
| 2008/0230173 A1 * | 9/2008 | Cho | H01J 9/205 156/182 |
| 2009/0020215 A1 | 1/2009 | Hood et al. | |
| 2009/0145654 A1 * | 6/2009 | Cha | H01J 11/12 174/350 |
| 2009/0205879 A1 * | 8/2009 | Halsey, IV | G06F 3/044 178/18.06 |
| 2009/0280329 A1 | 11/2009 | Rukavina et al. | |
| 2009/0284475 A1 * | 11/2009 | Nashiki | G06F 3/045 345/173 |
| 2009/0316417 A1 * | 12/2009 | Chari | G02B 6/0051 362/326 |
| 2010/0028564 A1 * | 2/2010 | Cheng | G02B 5/3025 428/1.1 |
| 2010/0046191 A1 * | 2/2010 | den Boer | H05K 9/0096 361/818 |
| 2010/0225533 A1 | 2/2010 | Bimanand et al. | |
| 2010/0116527 A1 * | 5/2010 | Khosla | H01B 1/24 174/254 |
| 2010/0140673 A1 * | 6/2010 | Daniel | H05K 1/0221 257/288 |
| 2010/0164358 A1 * | 7/2010 | Lee | H01J 11/10 313/313 |

(56) References Cited

U.S. PATENT DOCUMENTS

| | | | |
|---|---|---|---|
| 2010/0200286 A1 | 8/2010 | Melcher et al. | |
| 2010/0300729 A1* | 12/2010 | Matsuda | G03F 1/14 174/126.1 |
| 2010/0301320 A1 | 12/2010 | Rand et al. | |
| 2010/0304069 A1 | 12/2010 | Oguri et al. | |
| 2010/0315105 A1 | 12/2010 | Fornes | |
| 2011/0032622 A1* | 2/2011 | Kim | G02B 5/285 359/609 |
| 2011/0070448 A1 | 3/2011 | Matsumara et al. | |
| 2011/0088931 A1* | 4/2011 | Lettow | B82Y 30/00 174/257 |
| 2011/0310489 A1* | 12/2011 | Kajiya | G02B 3/0056 359/601 |
| 2012/0048612 A1* | 3/2012 | Bunyan | H02G 13/00 174/358 |
| 2012/0194441 A1* | 8/2012 | Frey | G06F 3/041 345/173 |
| 2012/0273263 A1* | 11/2012 | Nagarajan | H05K 1/097 174/257 |
| 2012/0328859 A1* | 12/2012 | Uprety | C23C 14/086 428/216 |
| 2013/0182405 A1* | 7/2013 | Kaufman | G02F 1/13439 362/19 |
| 2013/0228365 A1* | 9/2013 | Uprety | B32B 15/08 174/257 |
| 2013/0284497 A1* | 10/2013 | Kajiya | G02B 1/10 174/250 |
| 2013/0299214 A1* | 11/2013 | Frey | H05K 9/0096 174/253 |
| 2015/0137837 A1* | 5/2015 | Jiao | G01N 27/048 324/694 |
| 2015/0373831 A1* | 12/2015 | Rogers | H01M 10/02 429/121 |
| 2016/0081184 A1* | 3/2016 | Katagiri | H01L 51/0021 174/268 |
| 2016/0120039 A1* | 4/2016 | Bang | H01L 23/36 29/832 |

FOREIGN PATENT DOCUMENTS

| | | |
|---|---|---|
| JP | 2000-311527 A | 11/2000 |
| JP | 2008-117656 | 5/2008 |
| JP | 2008-201206 | 9/2008 |
| TW | 201139135 A1 | 11/2011 |
| WO | WO 2010/144770 A1 | 12/2010 |

OTHER PUBLICATIONS

Database WPI; Thomson Scientific; Xp-002690188; C:\EPOPROGS\SEA\.\.\. . . \epodata/sea/eplogf/internal.log; Jan. 21, 2013; 2 pages.
PCT International Preliminary Report on Patentability dated Sep. 2, 2014 for Application No. PCT/US2012/064979; 7 pages.
PCT International Search Report and the Written Opinion of the International Searching Authority mailed Feb. 4, 2013 for International Application No. PCT/US2012/064979; 11 pages.
http://www.novacentrix.com/product/metalon.php, "Metalon® Conductive Inks," 2010, 1 page.
http://wvvw.static.methode.com/static/cms_workspace/pdf/Sensors %20&%20Switches/Methode-Nano-Inks.pdf, "Nano-Silver and Nano-Carbon Inks," date: unknown, 3 pages.
http://vendor.parker.com/Groups/Seal/Divisions/Chomerics/ Chomerics%20Product%20Library. nsf/ 5b3d26c6b2630956852573da0065b80c/ 80939478572e2c07852574260067990c/$File/E%20- %20Windows,pdf,"Design Guidelines to EMI Shielding Windows," date: unknown, pp. E1-E24.
Huang, et al., "Graphene-Based Conducting Inks for Direct Inkjet Printing of Flexible Conductive Patterns and Their applications in Electric Circuits and Chemical Sensors," Nano Research, 4(7), 2011, pp. 675-684.
Jacoby, Keith T., et al., "Predicted and measured EMI shielding effectiveness of a metallic mesh coating on a sapphire window over a broad frequency range," date: unknown, 11 pages.
Jeong, Jin-A., et al,, "Ag grid/ITO hybrid transparent electrodes prepared by inkjet printing," Solar Energy Materials & Solar Cells, 2011, 95, pp. 1974-1978.
Griggs, Charles, et al., "Opportunities for Inkjet Printing in Industrial Applications," Industrial + Specialty Printing, May/Jun. 2010, 4 pages.
Niklasson, Gunnar A., et al., "Electrochromics for smart windows: thin films of tungsten oxide and nickel oxide, and devices based on these," Journal of Materials Chemistry, 17, 2007, pp. 127-156.
Christopher Wargo, "Characterization of Conductors for Printed Electronics," PChem Associates, 2008, www.nanopchem.com, 11 pages.
Office Action issued in Japanese patent application No. 2014-559882, dated Aug. 29, 2016, 7 pages.
Office Action issued in Chinese patent application No. 201280071821.3, dated Sep. 21, 2016, 25 pages.
Official Letter and Search Report, with English translation of Search Report, issued in Taiwanese Patent Application No. 10114934, dated May 26, 2016 (11 pages).
First Communication issued in European Patent Application No. 12 791 398.6, dated Jul. 1, 2016 (4 pages).
Chinese Office Action for Application No. 201280071821.3 dated Apr. 5, 2016 with English Translation, 20 pages.
Office action in U.S. Appl. No. 15/060,436, dated Apr. 24, 2017, 17 pages.
B.L. Butler, et al., "Solar Reflectance, Transmittance and Absorptance of Common Materials," Presented at the Solar Industrial Process Heat Conference, Oakland Hyatt House, Oakland, CA, Oct. 31-Nov. 2, 1979, 10 pages.
M.G. Faraj, et al., "PET as a plastic substrate for the flexible optoelectronic applications," Optoelectronics and Advanced Materials—Rapid Communications, vol. 5, No. 8, Aug. 2011, pp. 879-882.
Decision of Rejection issued in Chinese patent application No. 201280071821.3, dated Apr. 7, 2017, 25 pages.
Invitation to Pay Additional Fees with partial international search results issued in PCT/US2016/060393, dated Feb. 17, 2017, 6 pages.
International Search Report and Written Opinion issued in issued in PCT/US2016/060393, dated Apr. 10, 2017, 18 pages.

* cited by examiner

FIG. 2
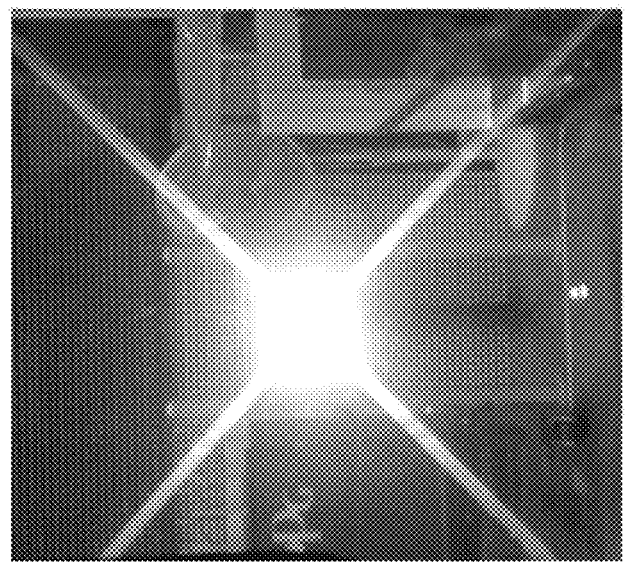
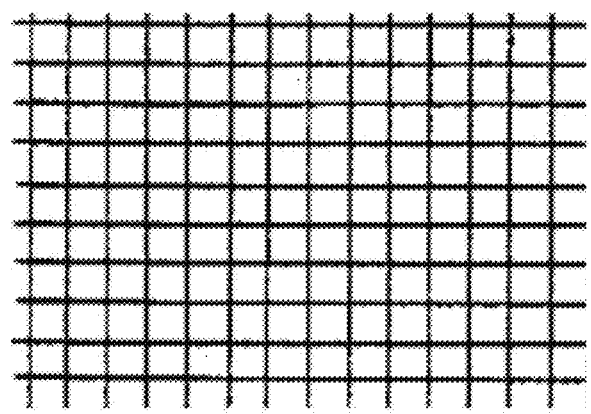

FIG. 3
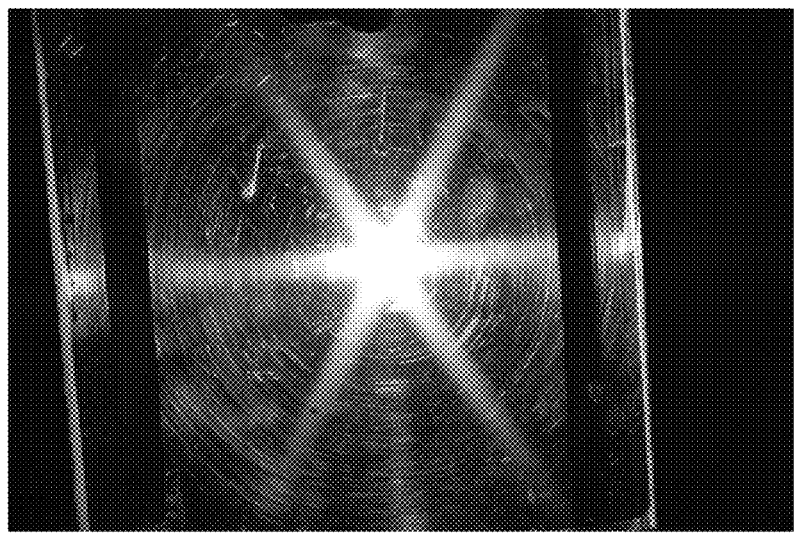
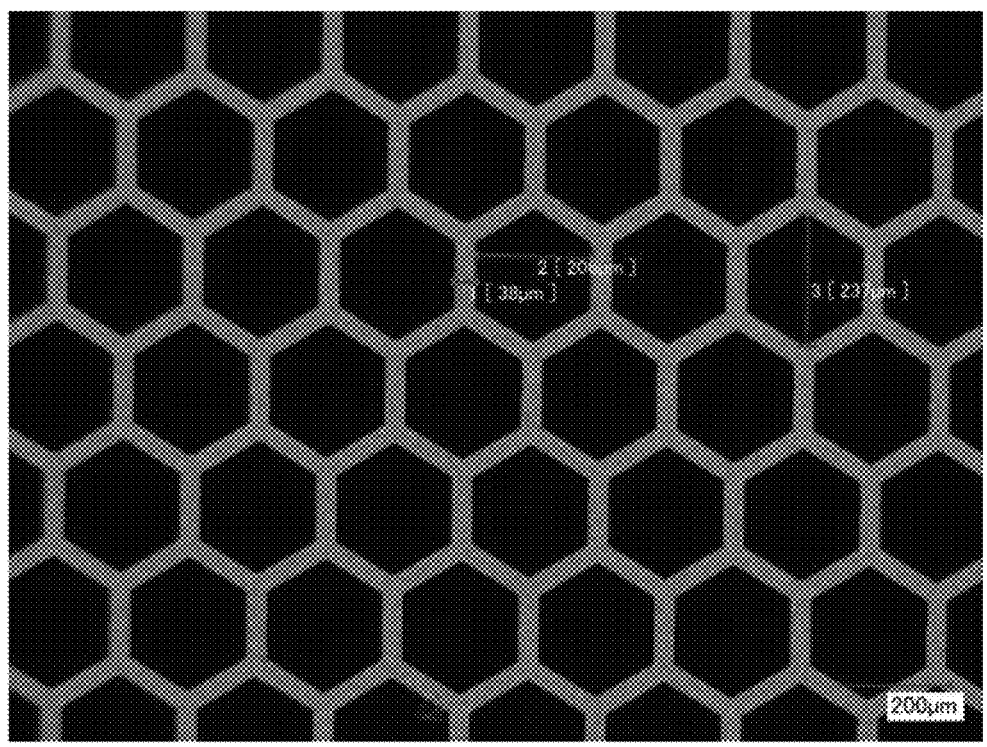

FIG. 4
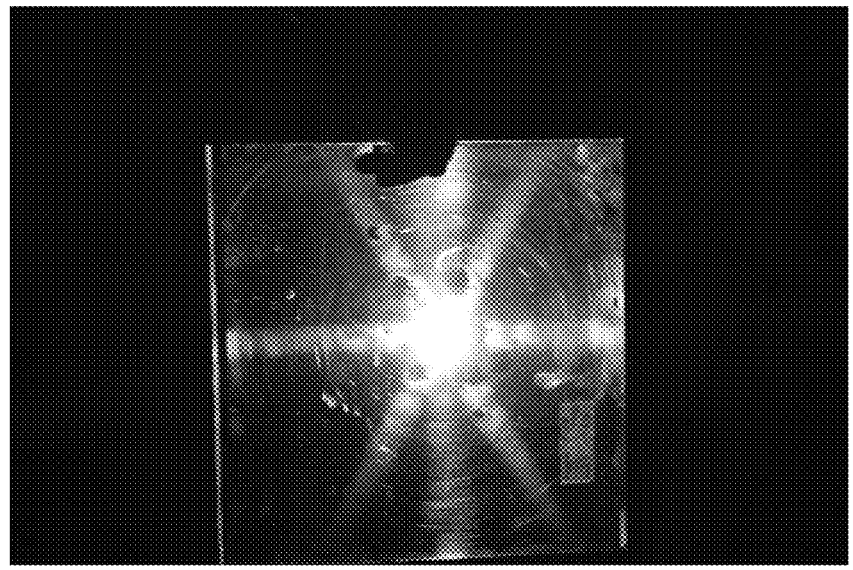
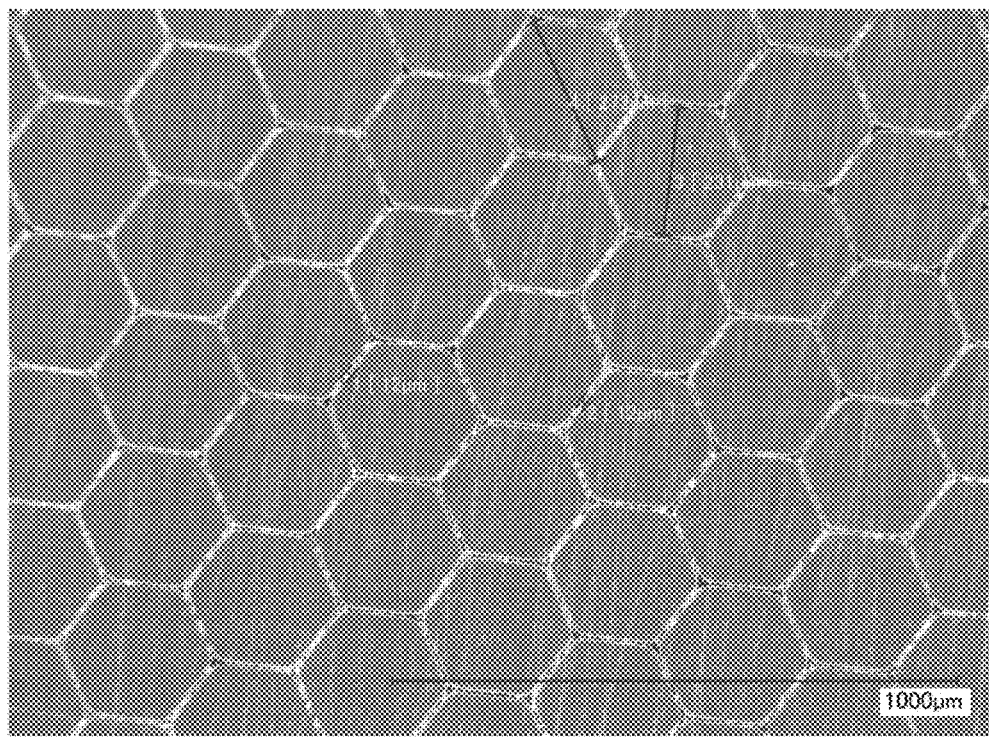

FIG. 5
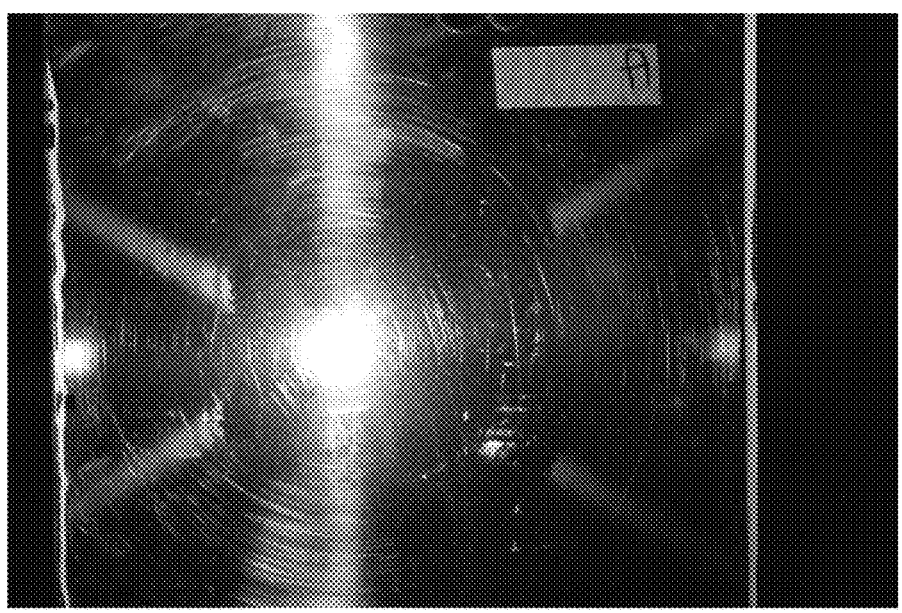
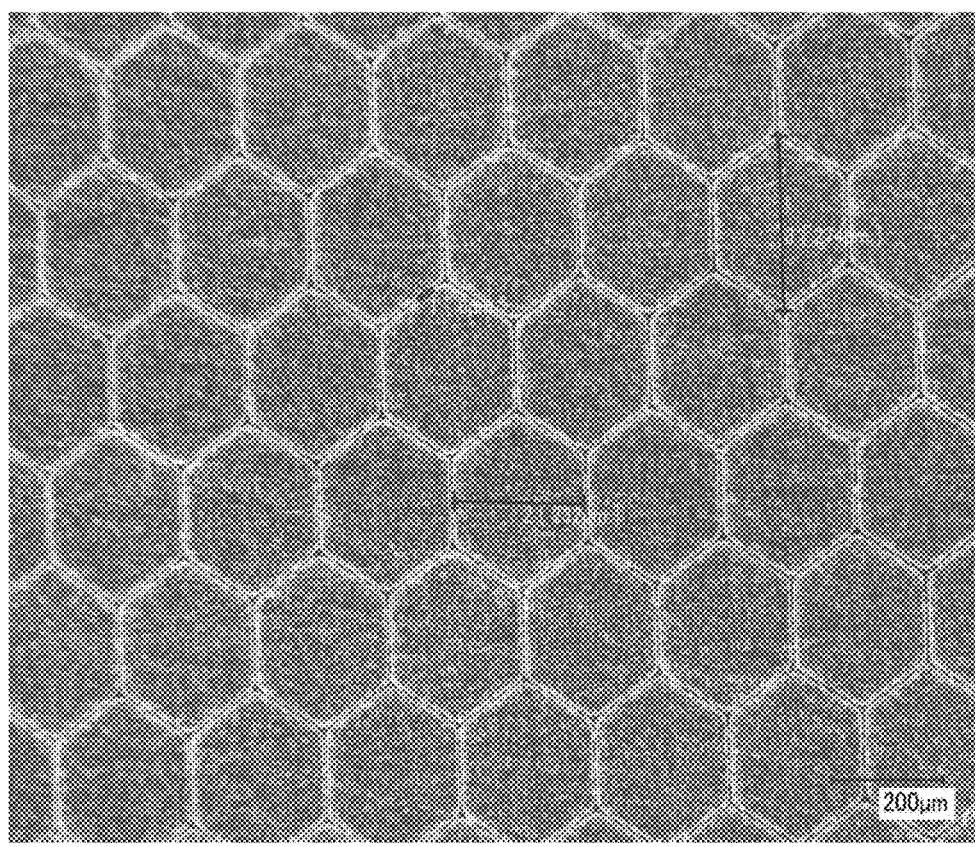

TRANSPARENCY INCLUDING CONDUCTIVE MESH INCLUDING A CLOSED SHAPE HAVING AT LEAST ONE CURVED SIDE

CROSS-REFERENCE TO RELATED APPLICATION(S)

This application claims priority to and the benefit of U.S. Provisional Application No. 62/260,151, filed in the U.S. Patent and Trademark Office on Nov. 25, 2015, the entire contents of which are incorporated herein by reference.

BACKGROUND

Conductive transparencies have a variety of uses. For example, a conductive transparency can be used as a canopy, window or windshield of a flying vehicle (e.g., an aircraft), or as an armor-grade transparency of a ground vehicle, such as the windshield or windows of an AM General HMMWV ("HUMVEE®"). HUMVEE® is a registered trademark of AM General, LLC. When used as an aircraft canopy, window or windshield, or as an armor-grade transparency of a ground vehicle, it is beneficial for the transparency to have defogging and de-icing capabilities. For example, defogging and de-icing can be accomplished by, among other things, heating the transparency (e.g., window or windshield) via the conductive portion of the transparency, such as an indium tin oxide (ITO) layer or electroplated grid, thereby preventing or reducing the formation of ice or condensation, or thawing ice or evaporating condensation that has already formed, on the transparency. An ITO layer is sometimes included as the conductive portion of armor-grade transparencies.

It is also beneficial for conductive transparencies to be able to prevent or reduce the buildup of static charge and to have electromagnetic interference (EMI) shielding capabilities, thereby shielding electronic systems within the vehicle from electromagnetic interference. The buildup of static charge can be prevented or reduced by draining or dissipating the static electricity that can build up on the transparency as a result of precipitation static and/or lightning strikes. Additionally, EMI shielding can be provided by preventing or reducing the transmission of disruptive electromagnetic radiation (i.e., electromagnetic radiation that interferes with electronic systems) through the transparency.

Typical aircraft transparencies include conductive portions that are expensive to produce, and often are prepared with a low percent yield. For example, the conductive portion of the transparency may be a woven wire mesh. Further, some aircraft windows include an electroplated grid, which uses the application of an organic primer, copper, photomask and resist, and the electroplating of copper and nickel. Each of these process steps adds to the complexity of the process, increases manufacturing expense and increases the risk of handling damage. For example, typical aircraft transparencies and armor-grade transparencies are produced using vacuum deposition processes that require expensive chambers, are time consuming, and may, themselves, create defects in the transparency or its coatings.

Additionally, certain aircraft transparencies often do not provide satisfactory de-icing, static dissipation, and/or EMI shielding capabilities, and some of the conductive transparencies that are currently in use have unsatisfactory lifetimes. Accordingly, there is a need for durable conductive aircraft transparencies and conductive armor-grade transparencies capable of providing de-icing, static dissipation and/or EMI shielding properties, and that can be produced by simpler and more economical methods than traditional industrial techniques, such as electroplating, vacuum deposition, and the formation of woven wire mesh.

SUMMARY

Embodiments of the present disclosure relate generally to a transparency including a plurality of electrically conductive lines (e.g., a conductive mesh). For example, the following description relates to a transparency including the plurality of electrically conductive lines, wherein at least one electrically conductive line intersects at least one other electrically conductive line and the electrically conductive lines reduce optical distortion and/or optical diffraction (e.g., optical distortion and/or optical diffraction of visible light such as, for example, Fraunhofer diffraction), and to a flying vehicle or ground vehicle including the transparency. Further, the following description relates to methods of preparing a transparency including a conductive mesh.

According to an embodiment, a transparency includes: a transparent substrate; and a plurality of electrically conductive lines on the transparent substrate, at least one of the electrically conductive lines intersecting at least one other electrically conductive line, and at least one of the electrically conductive lines having a width of no more than 50 µm (e.g., no more than 15 µm) to reduce distraction resulting from optical diffraction of light transmitted through or reflected by the transparency as compared to a transparency comprising electrically conductive lines having a width greater than 50 µm (or greater than 15 µm).

In an example embodiment, a distance between two of the electrically conductive lines may be no more than 1 mm.

The transparency may provide electromagnetic interference (EMI) shielding at a frequency of 1 Hz to 25 GHz (e.g., 3 Hz to 25 GHz or 1 GHz to 25 GHz).

The transparency may further include a transparent conductive oxide on the substrate.

The transparency may provide EMI shielding at a frequency of 3 Hz to 300 kHz.

At least one of the electrically conductive lines may have undulations.

The undulations in an example embodiment have peaks and troughs such that a distance between two adjacent peaks is no more than 30 µm.

The undulations in an example embodiment have peaks and troughs such that a distance between two adjacent peaks is no more than 30 µm.

The transparency may further include: a dielectric layer on the substrate; and a sensor including a conductive layer on the dielectric layer, wherein at least one layer selected from the dielectric layer and the conductive layer is formed by at least one method selected from lithography (e.g., photolithography), inkjet printing, and aerosol jet printing.

A heat layer may be between the substrate and the sensor.

The heater layer may include the plurality of electrically conductive lines.

The sensor may be selected from a temperature sensor, a crack detector, an arc detector, a strain gauge, and a moisture sensor.

A vehicle may include an example embodiment of the transparency.

The vehicle may be a flying vehicle.

The vehicle may be a ground vehicle.

A smart window may include the transparency.

According to an embodiment of the disclosure, a coated substrate may include: a substrate; a dielectric layer on the substrate; and a sensor including a conductive layer on the dielectric layer, wherein at least one layer selected from the dielectric layer and the conductive layer is formed by at least one method selected from lithography (e.g., photolithography), inkjet printing, and aerosol jet printing.

The coated substrate may further include a heater layer between the substrate and the sensor.

The sensor may be selected from a temperature sensor, a crack detector, an arc detector, a strain gauge, and a moisture sensor.

A vehicle may include an example embodiment of the coated substrate.

By including the electrically conductive lines (e.g., a conductive mesh), transparencies according to embodiments of the disclosure can be produced at a significantly lower cost than conventional aircraft or armor-grade transparencies, as the production of embodiments of the conductive mesh (and embodiments of the transparency itself) does not require the very expensive vacuum deposition chambers required to produce conventional transparencies. Additionally, the conductive mesh of embodiments of the disclosure can have any of a wide range of electrical conductivities and, consequently, provide excellent EMI shielding, static dissipation, de-icing and/or defogging.

According to an embodiment, a transparency includes: a transparent substrate; and a plurality of electrically conductive lines on the transparent substrate, the electrically conductive lines defining a polygon having at least one curved side having a radius of curvature of no more than 500 µm.

BRIEF DESCRIPTION OF THE DRAWINGS

The accompanying drawings, together with the specification, illustrate example embodiments of the present disclosure, and, together with the description, serve to explain the principles of the disclosure.

FIG. 2 includes an upper image showing Fraunhofer diffraction of point source light that has passed through a polycarbonate (PC) substrate including a conductive mesh having a substantially square-shaped grid arrangement, and a lower image showing a magnified view of the substantially square-shaped grid arrangement.

FIG. 3 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement FIG. 4 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement.

FIG. 5 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement.

DETAILED DESCRIPTION

Figure 1:
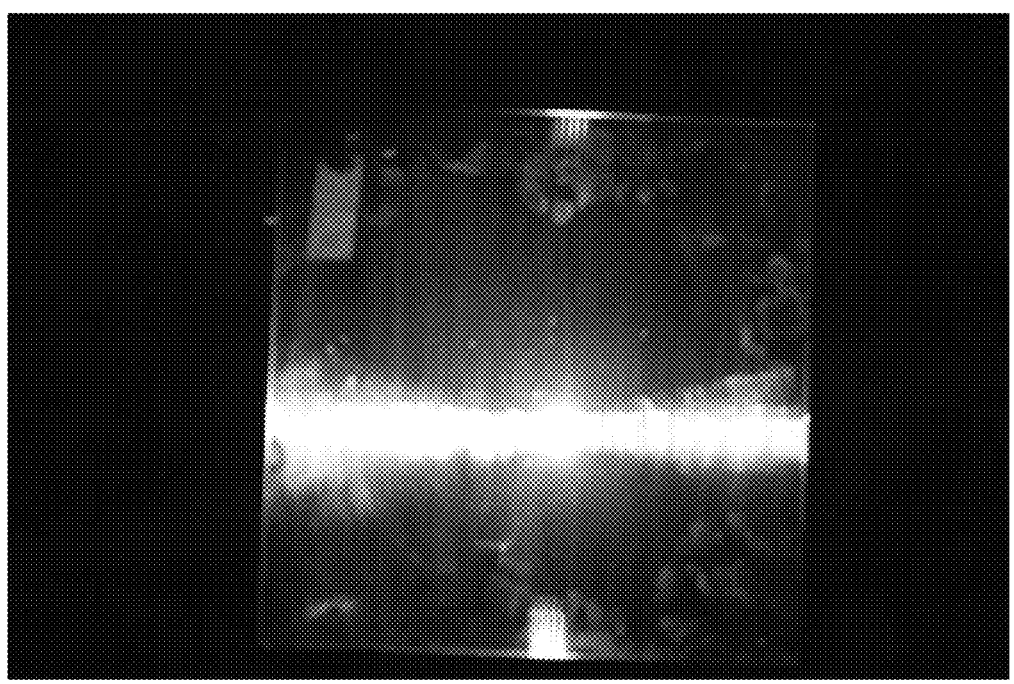
FIG. 1 is an image showing Fraunhofer diffraction of point source light that has passed through a polycarbonate (PC) substrate.

In the following detailed description and in the claims, various films and layers are described as being "on" one or more additional films and layer(s). This language simply denotes the relative positions of the films and layers. Thus, in some embodiments, two films and/or layers are literally right next to each other, while in other embodiments, the same two films and/or layers are separated by one or more additional film(s) and/or layer(s). In each case, one of the two films and/or layers is considered to be "on" the other film or layer. Also, "on" can mean "below." For example, a film or layer that is "on" another film or layer can also be considered "below" the other film or layer, depending upon the point of view. Additionally, as used herein, the term "film" refers to a thin, flexible sheet that does not hold a static shape when it is not supported by another feature.

Embodiments of the present disclosure are directed to a transparency including a conductive mesh. Such a transparency has a variety of uses, for example as a canopy, window, or windshield for a flying vehicle (e.g., an aircraft), or as an armor-grade windshield or window of a ground vehicle. For example, a transparency according to an embodiment of the disclosure may be used as the windshield or windows of an AM General HMMWV ("HUMVEE®"). Accordingly, example embodiments of the present disclosure are directed to a flying vehicle including a transparency including a conductive mesh. Embodiments of the present disclosure may also relate to smart windows, sensors (e.g., moisture sensors, crack detectors, arc detectors, strain gauges, temperature sensors, and the like), and the like. For example, embodiments of the present disclosure may relate to a sensor, such as a moisture sensor that can be utilized to detect the ingress of moisture into a heater film, which can locally damage the heater film, thereby resulting in damage to, or the failure of, a transparency (e.g., a window and/or a windshield). In some embodiments, the sensor may include a crack sensor that can be used to detect cracks (e.g., micro cracks) on or in a conductive film (e.g., a transparent conductive film, such as a conductive oxide film). The cracks (e.g., micro cracks) on or in the conductive film may generated by buildup of stress on the conductive film as a result of mechanical deformation of a transparency (e.g., a window and/or windshield) including the conductive film, and/or the cracks may be generated by excessive heat generation as a result of buildup of high voltage on the conductive film (e.g., a heater film) induced by a capacitive effect of p-static charge buildup on the transparency. In some embodiments, the sensor may include an arc detector that can be used to detect electric arcs on the transparency (e.g., the windshield and/or window) as a result of, for example, a lightning storm, which can damage the heater film.

The conductive mesh may include a plurality of electrically conductive lines and the electrically conductive lines may reduce optical distortion and/or optical diffraction (e.g., Fraunhofer diffraction). For example, when a light (e.g., visible light) is irradiated toward a substrate including the electrically conductive lines that reduce optical distortion and/or optical diffraction (e.g., optical distortion and/or optical diffraction of visible light), the transparency exhibits reduced optical distortion and/or optical diffraction (e.g., optical distortion and/or optical diffraction of visible light) as compared to a transparency that includes lines that do not have the features described herein (e.g., width, spacing, and/or shape). The conductive mesh and electrically conductive lines may be formed by any suitable method available in the art and may include any suitable material available in the art.

Embodiments of the electrically conductive lines may reduce optical distortion and/or optical diffraction (e.g., optical distortion and/or optical diffraction of visible light) by having a width (e.g., a width substantially parallel to the substrate along the longest dimension of the substrate) of no more than 50 µm (e.g., no more than 1, 2, 3, 4, 5, 6, 7, 8, 9, 10, 11, 12, 13, 14, 15, 19, 20, 24, 25, 29, 30, 34, 35, 39, 40, 44, 45, or 49 µm, or any range subsumed therein), but the electrically conductive lines are not limited thereto. For example, each of the electrically conductive lines may independently have a width in a range of 0.5 µm to 50 µm (or in any range subsumed therein such as, for example, a width in a range of 0.5 µm to 15 µm or 1 µm to 15 µm). Additionally, spaces (e.g., distances) between the electrically conductive lines may each have a width (or pitch) of no more than 1 mm, 900 µm, 800 µm, 700 µm, 600 µm, 500 µm, 400 µm, 300 µm, 275 µm, 250 µm, or 200 µm, but the spaces are not limited thereto. For example, a distance between two of the electrically conductive lines (a pitch) may be no more than 1 mm, 900 µm, 800 µm, 700 µm, 600 µm, 500 µm, 400 µm, 300 µm, 275 µm, 250 µm, or 200 µm, but the distances are not limited thereto. According to embodiments of the present disclosure, a transparency may include at least one electrically conductive line having a width of no more than 50 µm (e.g., no more than 15 µm) to reduce distraction resulting from optical diffraction of light transmitted through or reflected by the transparency as compared to a transparency including electrically conductive lines having a width greater than 50 µm (or greater than 15 µm), a distance between two of the electrically conductive lines greater than 1 mm, and/or an unsuitable shape defined by the electrically conductive lines.

The electrically conductive lines may be arranged as an array of apertures (e.g., a tessellation). The electrically conductive lines may be arranged in any suitable manner to reduce Fraunhofer diffraction, such as those described in U.S. Pat. No. 4,932,755, the entire contents of which are incorporated herein by reference. For example, the electrically conductive lines may define apertures (e.g., an array of apertures) defined by respective modified polygons having a plurality of curved sides, such that visible light from a point source of light that passes through the conductive mesh is diffracted by the curved sides of the apertures over a plurality of diverging, fan-like areas, thereby reducing the distraction of a viewer (e.g., a pilot) viewing the light through the transparency. The electrically conductive lines are not limited thereto, however, and may instead define apertures having any suitable shape.

Figure 28:
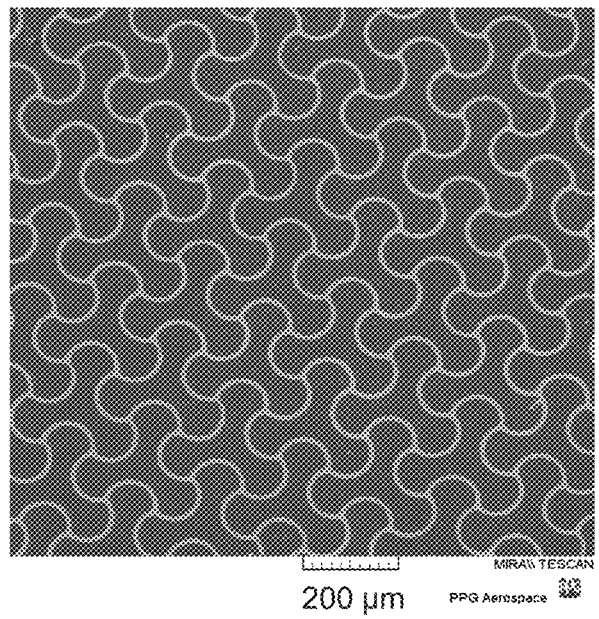
FIGS. 28-30 are SEM images of an embodiment of the electrically conductive lines.
Figure 29:
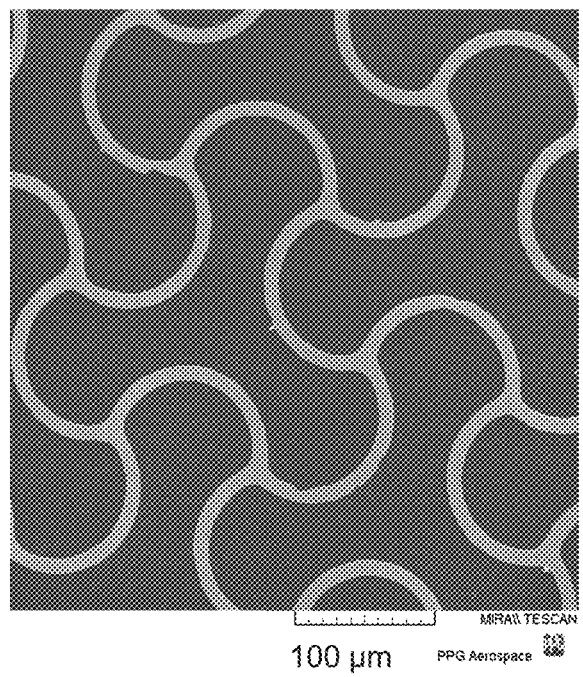
Figure 30:
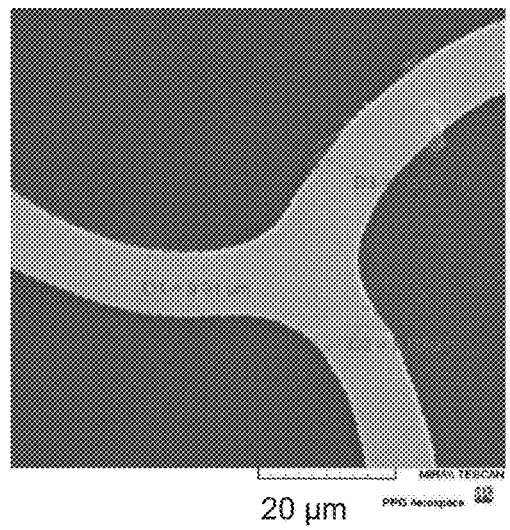

For example, the electrically conductive lines may define apertures having a plurality of shapes selected from, for example, circles, hexagons, pentagons, and combinations thereof. In some embodiments, a set of electrically conductive lines may form (e.g., define) at least one aperture having a circular shape, at least one aperture having a hexagonal shape, at least one aperture, having a pentagonal shape, at least one aperture having a diamond shape, or a combination thereof. In some embodiments, at least one of the apertures may have three-fold symmetry (e.g., as shown in FIGS. 28-30). For example, at least one of the apertures may have a trefoil shape. In some embodiments, at least one of the apertures may have C3 symmetry, with the proviso that the at least one aperture does not have symmetry higher than C3 symmetry, but the present disclosure is not limited thereto.

Figure 32:
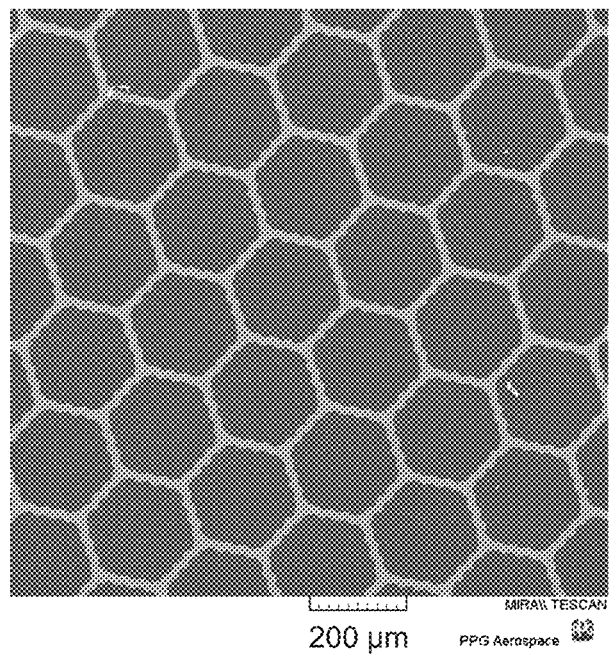
FIGS. 32-34 are SEM images of an embodiment of the electrically conductive lines.
Figure 33:
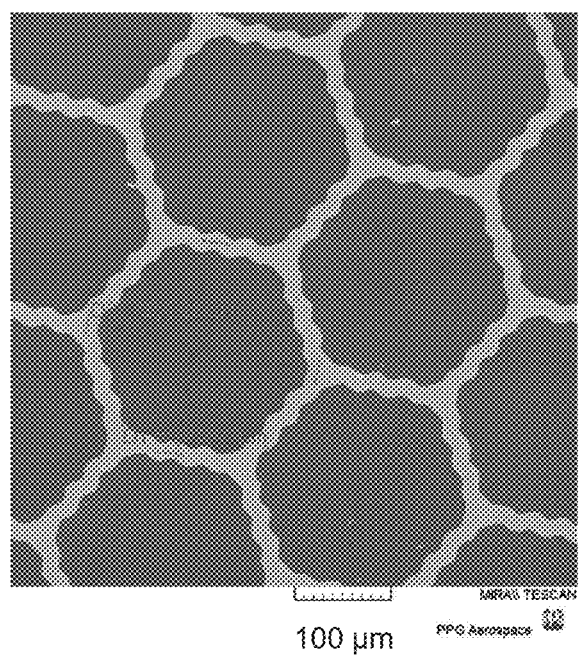
Figure 34:
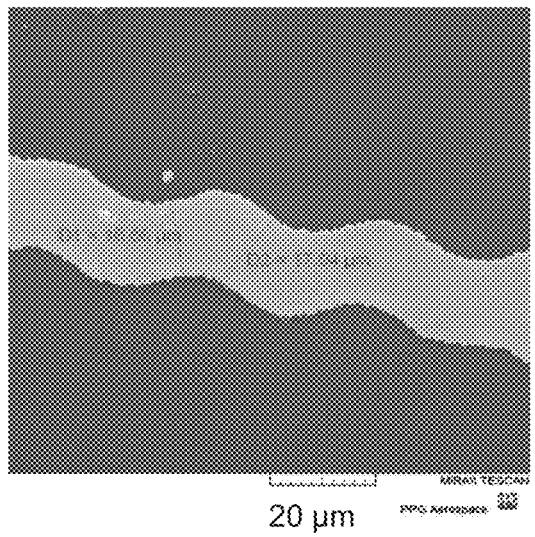

In some embodiments, the electrically conductive lines may be sawtoothed (e.g., wavy) and have an aperture shape as described herein (e.g., at least one aperture having a hexagonal shape formed of (e.g., defined by) wavy lines as shown in FIGS. 32-34). For example, at least one of the electrically conductive lines may have undulations such as, for example, undulations having a repeating pattern that is generally regularly spaced. In some embodiments, at least one of the electrically conductive lines may have undulations including a plurality of peaks and troughs such that a distance between two adjacent peaks and/or a distance between two adjacent troughs is no more than 30 µm (e.g., no more than 29, 28, 27, 26, 25, 24, 23, 22, 21, 20, 19, 18, 17, 16, 15, 14, 13, 12, 11, 10, 9, 8, 7, 6, 5, 4, 3, 2, or 1 µm). The two adjacent troughs may be the same as or different from the distance between the two adjacent peaks, but the present disclosure is not limited thereto.

In some embodiments, the electrically conductive lines may define an aperture having a shape of a polygon (e.g., a regular polygon such as, for example, a triangle quadrilateral, pentagon, hexagon, heptagon, octagon, nonagon, decagon, hendecagon, dodecagon, and the like) having at least one curved side having a radius of curvature of no more than 500 µm. For example, the curved side may have a radius of curvature of no more than 450, 400, 399, 350, 349, 300, 299, 250, 249, 200, 199, 150, 149, 100, 99, or no more than 50 µm, or any range subsumed therein. In some embodiments, the curved side has a shape of a semicircle (e.g., of approximately a semicircle). In some embodiments, the electrically conductive lines may define an aperture having a shape of a polygon in which each of the straight sides of the polygon has been replaced by a curved line having a single curvature. For example, the electrically conductive lines may define an aperture having a shape of a polygon having 3, 4, 5, 6, 7, 8, 9, 10, 11, 12, 13, 14, 15, 16, or 18 straight sides, in which each of the straight sides of the polygon has been replaced by a curved line having a single curvature. The electrically conductive lines that define the polygon may have any suitable width such as, for example, a width of no more than 50 µm (or no more than 15 µm), but the present disclosure is not limited thereto. In some embodiments, the electrically conductive lines define an array of apertures having a shape of a polygon in which each of the straight sides of the polygon has been replaced by a curved line having a single curvature, and in which the intersection of a curved line one of the polygons with a curved line of another one of the polygons has a rounded shape. For examples, the polygons may include one or more depressions for receiving a projection of an adjacent polygon. An intersection of a projection and a depression of a polygon may have a rounded shape.

FIG. 1 is an image showing Fraunhofer diffraction of point source light that has passed through a polycarbonate (PC) substrate. As can be seen in FIG. 1, the Fraunhofer diffraction of the light from the point source results in bright streaks that are capable of distracting a viewer (e.g., a pilot).

FIG. 2 includes an upper image showing Fraunhofer diffraction of point source light that has passed through a polycarbonate (PC) substrate including a conductive mesh having a substantially square-shaped grid arrangement, and a lower image showing a magnified view of the substantially square-shaped grid arrangement. As can be seen in the upper image of FIG. 2, the Fraunhofer diffraction of the light from the point source results in an X-shaped diffraction pattern capable of distracting a viewer (e.g., a pilot) and that follows the gridlines of the conductive mesh. In the substantially square-shaped grid shown in FIG. 2, electrically conductive lines of the conductive mesh have a width of about 25 µm, where the width is substantially parallel to the surface of the substrate on which the electrically conductive lines are located.

FIG. 3 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement. As can be seen in the upper image of FIG. 3, the Fraunhofer diffraction of the light from the point source results in a diffraction pattern having reduced intensity as compared to the diffraction pattern shown in FIG. 2. In the substantially hexagonal-shaped grid shown in FIG. 3, electrically conductive lines of the conductive mesh have a width of about 38 µm (the width being substantially parallel to the surface of the substrate on which the electrically conductive lines are located), a spacing along a first direction of about 206 µm, and a spacing along a second direction of about 237 µm, the second direction being substantially perpendicular to the first direction.

FIG. 4 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement. As can be seen in the upper image of FIG. 4, the Fraunhofer diffraction of the light from the point source results in a diffraction pattern having reduced intensity as compared to the diffraction pattern shown in FIG. 3. In the substantially hexagonal-shaped grid shown in FIG. 4, electrically conductive lines of the conductive mesh have a width of about 12 µm (the width being substantially parallel to the surface of the substrate on which the electrically conductive lines are located), a spacing along a first direction of about 231 µm, and a spacing along a second direction of about 272 µm, the second direction being substantially perpendicular to the first direction.

FIG. 5 includes an upper image showing Fraunhofer diffraction of point source light that has passed through a polycarbonate (PC) substrate including a conductive mesh having a substantially hexagonal-shaped grid arrangement, and a lower image showing a magnified view of the substantially hexagonal-shaped grid arrangement. As can be seen in the upper image of FIG. 5, the Fraunhofer diffraction of the light from the point source results in a diffraction pattern having reduced intensity as compared to the diffraction pattern shown in FIG. 4. In the substantially hexagonal-shaped grid shown in FIG. 5, electrically conductive lines of the conductive mesh have a width of about 6 or 7 µm (the width being substantially parallel to the surface of the substrate on which the electrically conductive lines are located), a spacing along a first direction of about 232 µm, and a spacing along a second direction of about 274 µm, the second direction being substantially perpendicular to the first direction.

In certain embodiments, the conductive mesh is formed by a plurality of electrically conductive lines on a polymer film, wherein at least one electrically conductive line intersects at least one other electrically conductive line. Example conductive meshes can be obtained from CIMA Nanotech, Inc., Dontech, Inc., Applied Nanotech Holdings, Inc., NanoMas Technologies, Inc., and FUJIFILM Dimatix, Inc. In other embodiments, the conductive mesh is formed by a plurality of electrically conductive lines on (e.g., physically contacting) a substrate, wherein at least one electrically conductive line intersects at least one other electrically conductive line. The conductive mesh and electrically conductive lines may be formed by any suitable method available in the art and may include any suitable material available in the art. For example, the plurality of electrically conductive lines may be deposited directly on a substrate utilizing an aerosol jet process (available from Optomec, Albuquerque, N. Mex.), inkjet printing, or lithography (e.g., photolithography) directly on the substrate, such as, for example glass, polyacrylate (e.g., stretched acrylic), polycarbonate, or polyurethane. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. Example electrically conductive lines can be prepared by inkjet printing conductive inks, such as the METALON® conductive inks available from Novacentrix. METALON® is a registered trademark of Novacentrix. Embodiments of the disclosure are directed to methods of preparing a transparency including a conductive mesh.

According to embodiments of the present disclosure, materials of the smart window, the heater layer, dielectric layer, temperature sensor, moisture sensor, crack detector, arc detector, strain gauge, and/or the like may be aerosol jet printed using processes available from Optomec, Albuquerque, N. Mex. For example, the electrically conductive lines may be formed (e.g., aerosol jet printed) to have widths of 0.5 µm to 28 µm, 0.5 µm to 25 µm, 10 µm to 28 µm, 10 µm to 25 µm, or, for example, 10 µm to 15 µm. The Optomec aerosol jet processes may be described as follows. The Aerosol Jet technology delivers the unique ability to print fine-feature conductive gridline onto almost any substrate. It utilizes aerodynamic focusing to precisely deposit conductive grid in dimensions ranging from 10 micrometers (microns) up to centimeter scale. The Aerosol Jet process begins with a mist generator that atomizes a source material. Particles in the resulting aerosol stream can then be refined in a virtual impactor and further treated on the fly to provide optimum process flexibility. The material stream is then aerodynamically focused using a flow guidance deposition head, which creates an annular flow of sheath gas to collimate the aerosol. The co-axial flow exits the flow guidance head through a nozzle directed at the substrate, which serves to focus the material stream to as small as a tenth of the size of the nozzle orifice (typically 100 µm).

Embodiments of the present disclosure will now be described with reference to the accompanying drawings, in which example embodiments of the invention are shown. The drawings are illustrative in nature and are not to be construed as limiting the present invention. In the drawings, the thickness of films, layers and regions may be exaggerated for ease of illustration.

Figure 6:
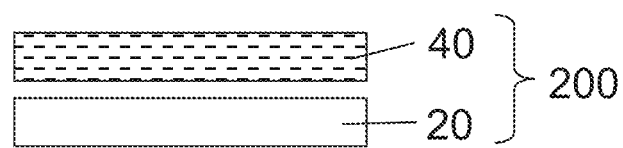
FIG. 6 is an exploded, cross-sectional view of a transparency including a conductive mesh.

An example embodiment of the transparency is shown in FIG. 6. The transparency 200 shown in FIG. 6 can be used as a canopy, window or windshield of an aircraft, or as an armor-grade transparency, such as an armor-grade transparency for a ground vehicle. As shown in FIG. 6, the transparency 200 includes a substrate 20 and a conductive mesh 40. The conductive mesh 40 includes a plurality of electrically conductive lines, wherein at least one electrically conductive line intersects at least one other electrically conductive line. The conductive mesh 40 may be on a polymer film, and the plurality of electrically conductive lines may physically contact the polymer film. Alternatively, the plurality of electrically conductive lines may be deposited (e.g., inkjet printed) directly on the substrate 20 (e.g., the electrically conductive lines may physically contact the substrate 20). The transparency, however, is not limited to having a single conductive mesh. For example, the conductive mesh 40 may be repeated to form a stacked structure on the substrate 30. The conductive mesh 40 may also be on opposite sides of the substrate 20 to form a sandwich structure. The conductive mesh 40 on opposite sides of the substrate 20 may be a single film, or a plurality of films that form a stacked structure.

According to certain embodiments of the present invention, the plurality of electrically conductive lines are spaced apart from one another. For example, the plurality of electrically conductive lines may be spaced apart by any distance suitable for a conductive mesh that provides EMI shielding, de-icing and/or defogging, and reduces optical distortion and/or optical diffraction (e.g., Fraunhofer diffraction) of visible light. Increasing the spacing between the electrically conductive lines is believed to reduce the intensity of optical distortion and/or optical diffraction due to the reduced number of lines in a given area of the substrate, but the present disclosure is not limited by any particular mechanism or theory. Thus, embodiments of the present disclosure can reduce the intensity of distraction (e.g., distraction resulting from optical distortion and/or optical diffraction of light passing through and/or being reflected by a transparency), but star effects resulting from light passing through and/or being reflected by the transparency may remain (e.g., a portion of the star effects may remain). Increasing the spacing between the electrically conductive lines decreases the EMI shielding performance. Thus, in some embodiments, the electrically conductive lines are spaced apart such that the electrically conductive lines provide both suitable EMI shielding and suitable optical distortion and/or optical diffraction (e.g., optical distortion and/or optical diffraction of visible light such as, for example, Fraunhofer diffraction). For example, the spacings should have a size that is suitable for preventing or reducing transmission through the transparency of the particular range of electromagnetic radiation that is being shielded. If the spacings are too large (e.g., larger than the wavelength of electromagnetic radiation to be shielded), the conductive mesh will not provide the desired shielding. In view of the effect of such spacings on the EMI shielding properties of the conductive mesh, the spacings in the mesh should be smaller or substantially smaller than the wavelength of the electromagnetic radiation that is being shielded (e.g., substantially smaller than the wavelength of the disruptive electromagnetic radiation that interferes with electronic systems).

Figure 7:
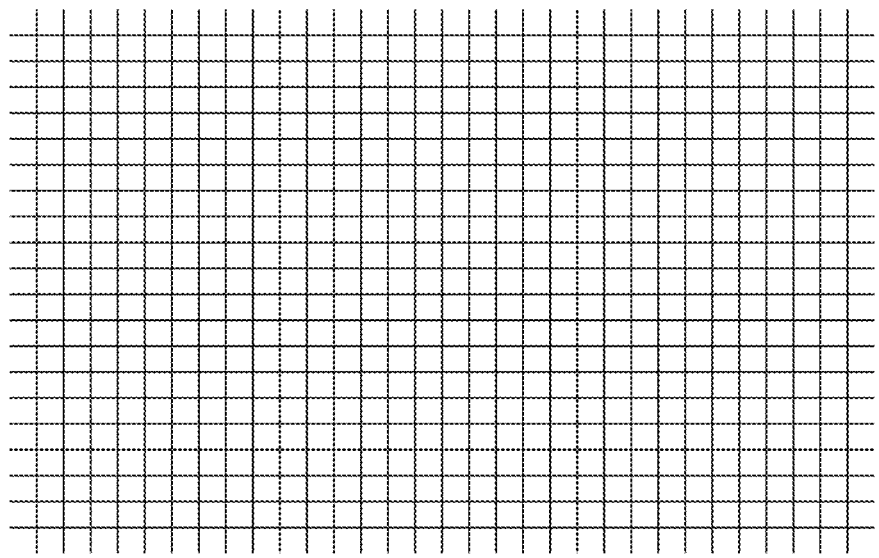
FIG. 7 is a schematic view of a plurality of electrically conductive lines according to an example embodiment of the present disclosure.

The arrangement of the electrically conductive lines in the mesh, however, is not limited. For example, the mesh (e.g., the plurality of electrically conductive lines) may be arranged in any form of pattern or tessellation. For example, the mesh may be arranged as a square grid, triangular tiling, hexagonal tiling, or grid formed from straight, undulating, sinusoidal or zigzag lines. The mesh may be arranged in any form of uniform, non-uniform, repeating or random pattern. An example embodiment of a square grid arrangement of the plurality of electrically conductive lines can be seen in the schematic view of the conductive mesh shown in FIG. 7. As can be seen in FIG. 7, the plurality of electrically conductive lines are shown as straight lines, which define a repeating pattern of squares between the electrically conductive lines. The electrically conductive lines, however, are not limited thereto and may have curved sides (e.g., may include an array of modified polygons having a plurality of curved sides).

Figure 8:
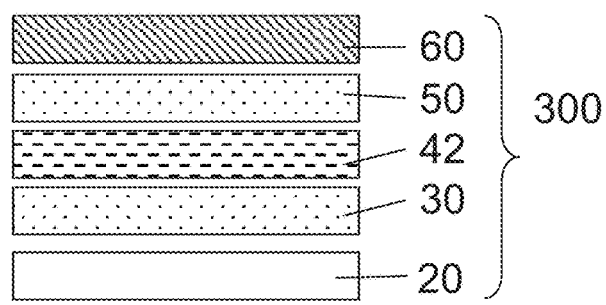
FIG. 8 is an exploded, cross-sectional view of a transparency including a conductive mesh.
Figure 9:
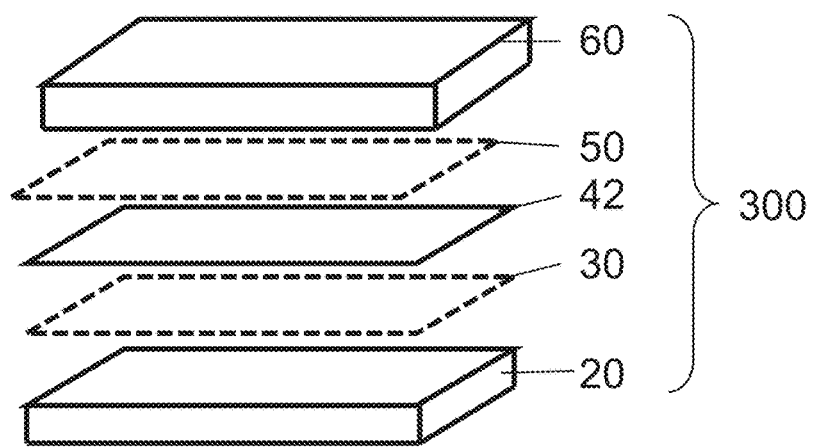
FIG. 9 is an exploded, perspective view of a transparency including a conductive mesh.

Additional films and layers of the transparency according to embodiments of the present invention will now be described. Depending upon the particular embodiment, these additional films and/or layers may or may not be present in the transparency. For example, a transparency according to an embodiment of the present invention is shown in FIG. 8. Additionally, an exploded perspective view of the transparency according to this embodiment is also shown in FIG. 9. As can be seen in FIGS. 8 and 9, the transparency 300 includes an overlayer 60, a first bonding film 50, a conductive mesh formed by a plurality of electrically conductive lines on a polymer film 42, a second bonding film 30, and a substrate 20. The overlayer 60, first bonding film 50, polymer film 42 and second bonding film 30 may be stacked on the substrate 20 once, or they may be repeated a plurality of times to form a plurality of stacked structures. Additionally, these films and layers may be on opposite sides of the substrate 20, to form a sandwich structure. The films and layers on the opposite sides of the substrate 20 may be stacked once, or they may be repeated a plurality of times to form a plurality of stacked structures.

The overlayer 60 protects the transparency. It should be durable and should be able to resist scratching or other forms of physical damage. The overlayer should also resist damage from weather or other forms of chemical attack. For example, the overlayer 60 may include any suitable organic resin, such as polyacrylate (e.g., stretched acrylic), polycarbonate (e.g., bisphenol A polycarbonate), or polyurethane, glass, or any other material having suitable transmissive and protective properties. In some embodiments, the polyacrylate is a stretched acrylic including cross-linked polymethylmethacrylate (PMMA) materials. Any suitable stretched acrylic available in the art may be utilized for the overlayer. The stretched acrylic may be formed by placing a cast billet (e.g., a cast billet of PMMA) in a biaxially stretched tool. For example, the cast billet may have a size of 6'×6', but the cast billet is not limited thereto. The substrate (the cast billet) is then heated above the Tg of the material of the cast billet and the substrate is stretched biaxially at a finite rate (any suitable rate utilized in the art may be utilized). The stretching improves the craze resistance, crack propagation and mechanical strength of the acrylic. In certain embodiments, the polyurethane of the overlayer is OPTICOR, which may be obtained from PPG Industries Inc. OPTICOR is a trademark of PPG Industries Inc. For example, the polyurethane of the overlayer may be any polyurethane set forth in U.S. Patent Application Publication No. 2009/0280329 A1, the entire contents of which are herein incorporated by reference. The overlayer may have a thickness in a range of about 0.1 to about 0.75 inches.

The first bonding film 50 covers imperfections in the overlayer 60 and promotes adhesion of the overlayer 60 to the polymer film 42. For example, the first bonding film 50 couples the overlayer 60 to the polymer film 42, and should be capable of bonding thereto. In certain embodiments, the first bonding film 50 includes polyurethane, polyvinyl butyral (PVB), silicone, or any other material having suitable adhesive properties. The polyurethane may have a molecular weight in a range of 100,000 to 300,000 g/mol, but it is not limited thereto. The polyvinylbutyral may have a molecular weight in a range of 200,000 to 300,000 g/mol, but it is not limited thereto. The first bonding film 50 may have a thickness in a range of about 0.003 to about 0.100 inches.

Similarly to the first bonding film 50, the second bonding film 30 covers imperfections in the substrate 20 and promotes adhesion of the substrate 20 to the polymer film 42. As such, second bonding film 30 couples the substrate 20 to the polymer film 42, and should be capable of bonding thereto. In certain embodiments, the second bonding film 30 includes polyurethane, polyvinyl butyral (PVB), silicone, or any other material having suitable adhesive properties. The polyurethane may have a molecular weight in a range of 100,000 to 300,000 g/mol, but it is not limited thereto. The polyvinylbutyral may have a molecular weight in a range of 200,000 to 300,000 g/mol, but it is not limited thereto. The second bonding film 30 may have a thickness in a range of about 0.003 to about 0.100 inches.

As set forth above, in certain embodiments, the conductive mesh is formed by a plurality of electrically conductive lines on the polymer film 42. The plurality of electrically conductive lines can be inkjet printed, or deposited or formed by any other suitable method (e.g., lithography such as, for example, photolithography), on any suitable polymer film, such as, for example, polyethylene terephthalate, polycarbonate, or polyurethane. According to other embodiments of the present invention, the conductive mesh is formed by a plurality of electrically conductive lines inkjet printed, aerosol jet deposited, formed by lithography (e.g., photolithography), or deposited or formed by any other suitable method available in the art on glass, polyacrylate (e.g., stretched acrylic), polycarbonate, or any other suitable substrate. In any of the embodiments of the invention, the plurality of electrically conductive lines can be prepared by inkjet printing conductive inks, such as the METALON® conductive inks available from Novacentrix. In certain embodiments, the plurality of electrically conductive lines include any suitable inkjet printed metal, such as a metal selected from the group consisting of copper (Cu), gold (Au), nickel (Ni), silver (Ag), and combinations thereof. For example, the plurality of electrically conductive lines may include Cu. The plurality of electrically conductive lines may further include epoxy, or any other material having suitable binding properties.

As described further below, the plurality of electrically conductive lines may be formed such that the transparency provides EMI shielding. The plurality of electrically conductive lines may be formed such that the transparency provides EMI shielding at a frequency of 1 Hz to 25 GHz (e.g., 3 Hz to 25 GHz or 1GHz to 25 GHz). Additionally, as described further below, the plurality of electrically conductive lines may de-ice the transparency by heating the transparency when an electric current is passed through at least one electrically conductive line. The EMI shielding or de-icing capabilities of an example transparency may result from the sheet resistance of the conductive mesh 40. For example, in certain embodiments, the conductive mesh 40 may have a sheet resistance in a range of about 0.02 to about 1,000 ohms/sq. In other embodiments, the conductive mesh 40 may have a sheet resistance of less than 400 ohms/sq. In still other embodiments, the conductive mesh 40 may have a sheet resistance of less than 100 ohms/sq. In still other embodiments, the conductive mesh may have a sheet resistance in a range of more than 0.1 ohms/sq to about 1,000 ohms/sq, more than 0.11 ohms/sq to about 1,000 ohms/sq, more than 0.15 ohms/sq to about 1,000 ohms/sq, or more than 0.2 ohms/sq to about 1,000 ohms/sq. In some embodiments, the conductive mesh is substantially free of silver and has a sheet resistance in a range of about 0.02 to about 1,000 ohms/sq. As used herein, the statement "the conductive mesh is substantially free of silver" means that silver is only present in the conductive mesh, if at all, as an incidental impurity. In some embodiments, the conductive mesh is completely free of silver.

According to embodiments of the disclosure, a transparency may include the plurality of electrically conductive lines and a transparent conductive oxide (e.g., indium tin oxide) such that the transparency provides EMI shielding at low radio frequencies such as, for example, 3 Hz to 300 kHz, 3 to 30 Hz, 30 to 300 Hz, 300 Hz to 3 kHz, 3 to 30 kHz, 30 to 300 kHz, or any suitable range therebetween. For example, the transparent conductive oxide may provide EMI shielding at the low radio frequencies (e.g., 3 Hz to 300 kHz) and the plurality of electrically conductive lines may provide EMI shielding at higher frequencies (e.g., 300 kHz to 25 GHz or 1 GHz to 25 GHz) such that the transparency provides EMI shielding at a frequency of 3 Hz to 26 GHz. The transparent conductive oxide may be inboard or outboard of the plurality of electrically conductive lines, or both. For example, the transparent conductive oxide may be sandwiched between two or more layers, each of the layers including a plurality of the electrically conductive lines. In some embodiments, the transparency may include a plurality of electrically conductive lines sandwiched between two or more layers of a transparent conductive oxide (e.g., indium tin oxide). In some embodiments, the plurality of electrically conductive lines and the transparent conductive oxide (e.g., indium tin oxide) may be in a stacked structure (e.g., an alternating stacked structure).

The conductive mesh 40 may be on a polymer film 42. The polymer film may include any suitable polymer, such as polyethylene terephthalate, polycarbonate, or polyurethane, but the present invention is not limited thereto. In certain embodiments, the plurality of electrically conductive lines physically contact the polymer film. For example, the plurality of electrically conductive lines may be inkjet printed on the polymer film (e.g., deposited on the polymer film by inkjet printing). The polymer film may have a thickness in a range of about 70 μm to about 1,000 μm. The plurality of electrically conductive lines may each have a width in a range of about 20 μm to about 50 μm. The plurality of electrically conductive lines may each have a thickness (e.g., a height above the surface of the substrate on which the electrically conductive lines are located) in a range of about 50 nm to about 5 μm. The thickness and/or width of the electrically conductive lines may be varied to vary the EMI shielding, de-icing and/or defogging properties of the transparency.

Similarly to the overlayer 60, the substrate 20 also protects the transparency 300. As such, the substrate 20 should be durable and should be able to resist scratching or other forms of physical damage. The substrate should also resist damage from weather or other forms of chemical attack. For example, the substrate 20 may include any suitable organic resin, such as polycarbonate (e.g., bisphenol A polycarbonate), polyacrylate (e.g., stretched acrylic), or polyurethane, glass, or any other material having suitable transmissive and protective properties. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. The substrate may have a thickness in a range of about 0.125 to about 0.75 inches.

Methods of preparing the transparency now will be described generally. For example, according to one embodiment of the present invention, a method of preparing a transparency includes lithographically forming (e.g., photolithographically forming), inkjet printing, aerosol jet depositing, knitting, nano-self assembling conductive nanoparticles (e.g., methods such as physical vapor deposition, chemical solution deposition, chemical vapor deposition, or the like may be used) electrically conductive lines onto a substrate, wherein at least one electrically conductive line intersects at least one other electrically conductive line. As discussed above, the substrate may include glass, polyacrylate (e.g., stretched acrylic), polycarbonate, OPTICOR, or any other material having suitable transmissive and protective properties. In certain embodiments, the polyurethane of the substrate is OPTICOR, which may be obtained from PPG Industries Inc. OPTICOR is a trademark of PPG Industries Inc. For example, the polyurethane of the substrate may be any polyurethane set forth in U.S. Patent Application Publication No. 2009/0280329 A1, the entire contents of which are herein incorporated by reference. The electrically conductive lines may be formed by inkjet printing or aerosol jet printing any suitable ink or other suitable material onto the substrate, or formed by lithography (e.g., by utilizing a photomask having a suitable grid pattern and grid size). For example, electrically conductive lines can be prepared by inkjet printing conductive inks, such as the METALON® conductive inks available from Novacentrix onto the substrate. The inkjet printing may be performed according to any suitable inkjet printing technique, such as those described in Huang, Lu, et al., *Graphene-based conducting inks for direct inkjet printing of flexible conductive patterns and their applications in electric circuits and chemical sensors,* Nano Research (2011), vol. 4, issue 7, 675-684, the entire contents of which are herein incorporated by reference.

Inkjet printing has the advantages of being a low-cost, non-contact application that is compatible with a wide array of substrates. Additionally, inkjet printing does not require mask patterning, can be done at low temperature, and does not require vacuum processing. Inkjet printing can deposit conductive fluids without contacting the substrate. Inkjet printers can be driven digitally with a computer to draw gridlines precisely. The inkjet printer may have several nozzles spaced apart by a distance of about 254 microns and may form drop sizes in a range of about 1 to about 10 picoliters, but the present invention is not limited thereto. In certain embodiments, the nozzles apply the ink droplets to the substrate as a result of the piezoelectric effect. For example, as described in Griggs, C., et al., *Opportunities for Inkjet Printing in Industrial Applications,* Industrial+Specialty Printing, May/June 2010 (available at http://www.dimatix.com/files/isp05-0610p18-22.pdf), the entire contents of which are herein incorporated by reference, inkjet printing may be used to print features as small as 20 μm.

Figure 10:
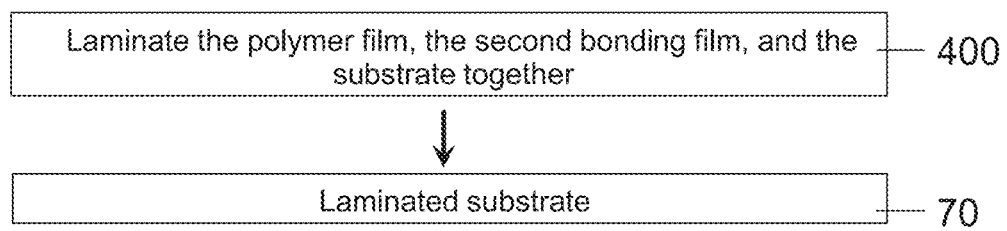
FIG. 10 is a flowchart showing lamination of the polymer film, the second bonding film, and the substrate together to form a laminated substrate.
Figure 11:
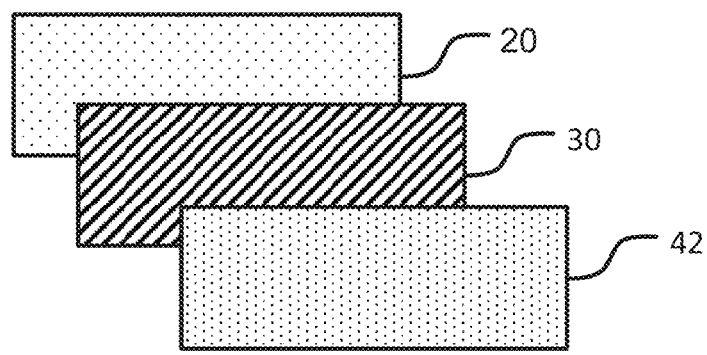
FIG. 11 is a schematic illustration showing lamination of the polymer film, the second bonding film, and the substrate together to form a laminated substrate.

In another embodiment of the present invention, a method of preparing a transparency includes laminating a polymer film and a substrate together, wherein a conductive mesh is formed by a plurality of electrically conductive lines on the polymer film. For example, as shown in FIG. 10, the polymer film, the second bonding film, and the substrate (e.g., the polymer film 42, the second bonding film 30, and the substrate 20) may be laminated together in a lamination process 400 to form a laminated substrate 70. A schematic illustration of this lamination process is shown in FIG. 11. This lamination process may include heating the polymer film, the second bonding film, the second bonding film, and the substrate at a temperature in a range of about 200 to about 300° F. Further, this lamination process may include pressing the polymer film, the second bonding film, and the substrate at a pressure in a range of about 50 to about 250 psi. Laminating the polymer film, the second bonding film, and the substrate together may be carried out for a time period in a range of about 15 minutes to about 5 hours.

Figure 12:
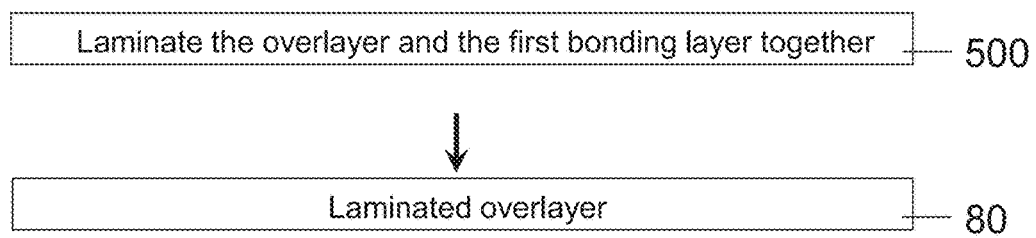
FIG. 12 is a flowchart showing lamination of the overlayer and the first bonding film together to form a laminated overlayer.
Figure 13:
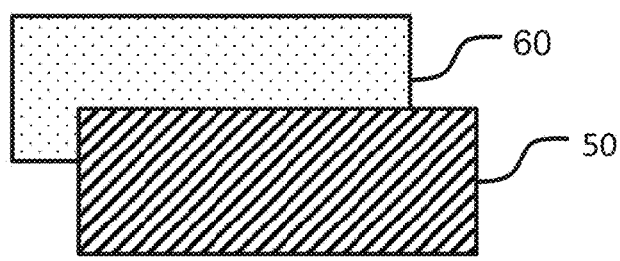
FIG. 13 is a schematic illustration showing lamination of the overlayer and the first bonding film together to form a laminated overlayer.

As shown in FIG. 12, the overlayer and the first bonding film (e.g., the overlayer 60 and the first bonding film 50) may be laminated together in a lamination process 500 to form a laminated overlayer 80. A schematic illustration of this lamination process is shown in FIG. 13. This lamination process may include heating the overlayer and the first bonding film at a temperature in a range of about 100 to about 300° F. Further, this lamination process may include pressing the overlayer and the first bonding film at a pressure in a range of about 100 to about 250 psi. Laminating the overlayer and the first bonding film together may be carried out for a time period in a range of about 1 to about 5 hours.

Figure 14:
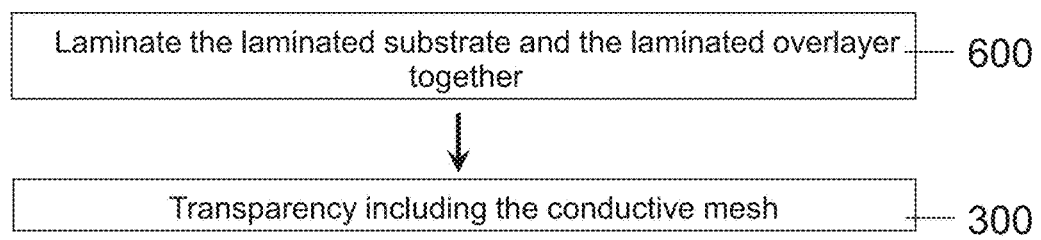
FIG. 14 is a flowchart showing lamination of the laminated overlayer and the laminated substrate together to form a transparency.
Figure 15:
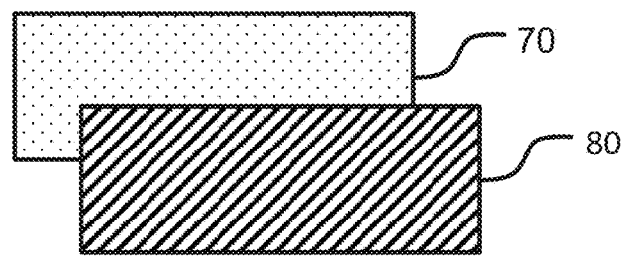
FIG. 15 is a schematic illustration showing lamination of the laminated overlayer and the laminated substrate together to form a transparency.

As shown in FIG. 14, the laminated overlayer 80 and the laminated substrate 70 may be laminated together in a lamination process 600 to form a transparency 300. A schematic illustration of this lamination process is shown in FIG. 15. This lamination process may include heating the laminated overlayer and the laminated substrate at a temperature in a range of about 100 to about 300° F. Further, this lamination process may include pressing the laminated overlayer and the laminated substrate at a pressure in a range of about 100 to about 250 psi. Laminating the laminated overlayer and the laminated substrate together may be carried out for a time period in a range of about 1 to about 5 hours. One or more of the above-described lamination processes may be carried out in an airtight vacuum plastic bag that has been evacuated. Additionally, one or more of the above-described lamination processes may be carried out in an autoclave.

A transparency according to embodiments of the present invention may be a flat or shaped transparency. Accordingly, the above-described methods of preparing the transparency may also include shaping the transparency. The transparency may be shaped before, during, or after any of the above-described preparation processes. For example, the substrate may be shaped before, during or after the formation of the plurality of electrically conductive lines directly on the substrate. Additionally, the substrate may be shaped before, during or after the laminating of the substrate and the polymer film together. For example, the substrate may be shaped before or after the polymer film, the second bonding film, and the substrate are laminated together to form the laminated substrate, or it may be shaped during that lamination process. Further, the substrate may be shaped before or after the overlayer and the first bonding film are laminated together to form the laminated overlayer, or it may be shaped during that lamination process. Similarly, the substrate may be shaped before or after the laminated overlayer and the laminated substrate are laminated together to form the transparency, or it may be shaped during that lamination process.

Transparencies according to embodiments of the invention provide significant advantages over certain aircraft transparencies and armor-grade transparencies. For example, by using the conductive meshes described herein, transparencies according the present disclosure can be made without using the multi-million dollar vacuum deposition chambers required to prepare certain aircraft transparencies and armor-grade transparencies. Accordingly, the transparencies described herein can be produced at a much lower cost than certain aircraft and armor-grade transparencies.

Aerospace and armor-grade transparency applications have particular requirements (as discussed further below) that are suitably met by embodiments of the present disclosure. Indeed, the present inventors were surprised by the remarkable performance of the presently described transparencies and conductive meshes in aerospace and armor-grade applications. Example embodiments of the conductive meshes and transparencies exhibit good durability, EMI shielding, de-icing, and/or defogging capabilities.

Although conductive meshes may also be suitable for use with, for example, display devices, the conductive meshes of the present disclosure are directed to the particular requirements of aerospace and armor-grade transparency applications. For example, the conductive meshes according to embodiments of the present disclosure include the particular thicknesses, materials, configurations, and/or sheet resistance described herein. Conductive meshes for other applications, such as display devices, may not meet the requirements of aerospace and armor-grade transparency applications. For example, conductive meshes for display devices, in which dust is a primary concern, may be too thin and have too high of a sheet resistivity for aerospace and armor-grade transparency applications. Additionally, conductive meshes for display devices are not intended to be used for de-icing or defogging.

Example transparencies of the present disclosure may provide the EMI shielding required for an aircraft or armor-grade transparency. For example, the transparency may prevent or reduce the transmission of disruptive electromagnetic radiation (i.e., electromagnetic radiation that interferes with electronic systems) through the transparency. By preventing or reducing the transmission of disruptive electromagnetic radiation through the transparency, the transparency prevents or reduces the effect of electromagnetic interference on electronic systems, such as electronic systems within an aircraft. Additionally, the EMI shielding of the transparency prevents or reduces the effects of electromagnetic interference emitted from electronic systems within the aircraft on electronic systems outside of the aircraft.

The EMI shielding properties of the conductive mesh result, at least in part, from its electrical conductivity. For example, the application of an electric field to one side of the conductive mesh may induce a current in the conductive mesh, which causes the movement of charges within the conductive mesh and thereby cancels the field on the other side of the transparency. As a result of the induced current, certain electromagnetic radiation (e.g., electromagnetic radiation that interferes with electronic systems) is at least partially reflected by the conductive mesh, thereby preventing or reducing the transmission of that electromagnetic radiation through the transparency. Oscillating magnetic fields interact with the conductive mesh in a substantially similar manner, but static magnetic fields do not.

Figure 16:
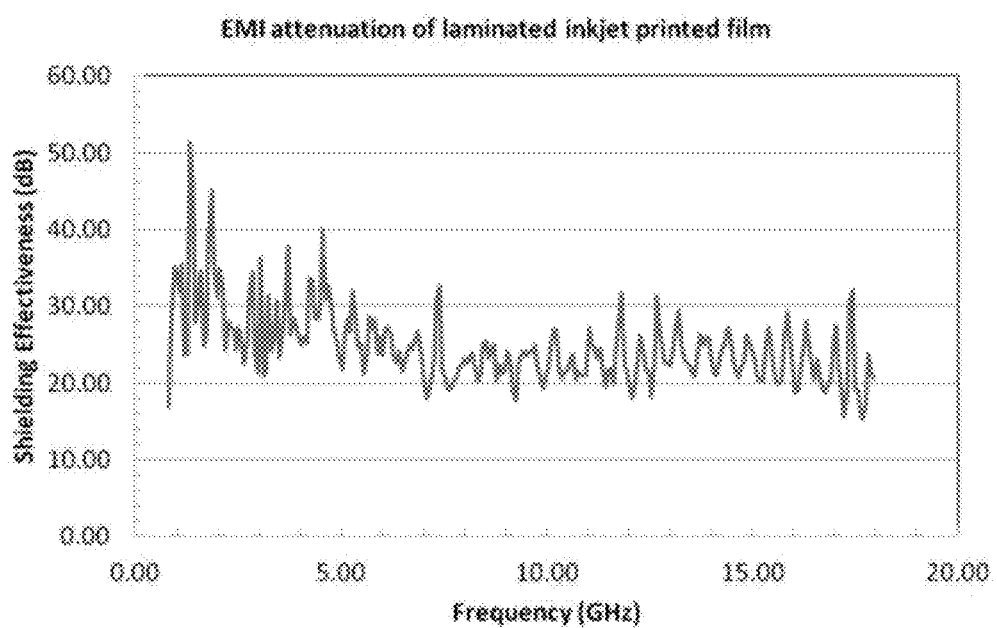
FIG. 16 is a graph showing the EMI shielding effectiveness of an example transparency over a range of frequencies.

Because the EMI shielding of the conductive mesh results, at least in part, from the induced current in the conductive mesh, the shielding effectiveness of the conductive mesh is at least partially dependent upon the resistance (or sheet resistance; i.e., electrical conductivity) of the conductive mesh. For example, as the resistance (or sheet resistance) of the conductive mesh increases, it becomes more difficult to induce a current within the conductive mesh. Consequently, increasing the resistance of the conductive mesh typically reduces the EMI shielding effectiveness of the conductive mesh. Accordingly, the transparency may provide EMI shielding by appropriately selecting the electrical conductivity (or sheet resistance) of the conductive mesh. For example, the EMI shielding effectiveness of an example transparency, which includes an example conductive mesh between a polycarbonate substrate and a polycarbonate overlayer, can be seen in the graph shown in FIG. 16. As can be seen in FIG. 16, the transparency provides EMI shielding in a range of about 20 to about 50 dB for electromagnetic radiation having a frequency in a range of about 1 GHz to about 18 GHz, and the average shielding effectiveness at 18 GHz is 25 dB. In some embodiments, the transparency provides EMI shielding at a frequency of 100 kHz to 1 GHz (e.g., 1 to 500 kHz, 1 to 400 kHz, 1 to 300 kHz, 1 to 200 kHz, or 1 to 100 kHz) and a shielding effectiveness of 1dB to 80 dB (e.g., 1 to 60 dB, 1 to 40 dB, 1 to 20 dB). To provide the EMI shielding required for an aircraft or armor-grade transparency, the transparency may include an electrical connection, such as bus bars, but such an electrical connection may not be necessary to provide EMI shielding.

Additionally, the electrical conductivity of the conductive mesh may allow the transparency to prevent or reduce the buildup of static charge on the transparency that would otherwise result from precipitation and/or lightning strikes. For example, the conductive mesh may have a low sheet resistance (i.e., high electrical conductivity), and thereby drain or dissipate the static charge that would otherwise buildup on the transparency. A conductive mesh having low sheet resistance may also provide additional advantages, such as radar attenuation. Accordingly, the conductive mesh may have a sheet resistance in a range of about 0.02 to about 1,000 ohms/sq. For example, the conductive mesh may have a sheet resistance of less than 400 ohms/sq, or less than 100 ohms/sq. In contrast to embodiments of the present disclosure, it is believed that a sheet resistance of less than 0.3 ohms/sq cannot be achieved with a continuous indium tin oxide (ITO) conductive coating, which, in some cases, may be required for special aircraft transparencies.

In addition to the resistance (or sheet resistance) of the conductive mesh, the EMI shielding of the conductive mesh also depends upon the composition of the conductive mesh (e.g., the composition of the electrically conductive lines), the thickness of each electrically conductive line, the size of the shielded volume, the frequency and size of the electromagnetic radiation being shielded, and the characteristics of the spacings between the electrically conductive lines in the conductive mesh.

In addition to, or instead of, providing EMI shielding capabilities, the transparency may de-ice or defog the transparency by heating the transparency when an electric current is passed through at least one electrically conductive line of the conductive mesh. That is, defogging or de-icing may be accomplished by applying an electric current to at least a portion of the conductive mesh to heat the transparency (e.g., the canopy, window, or windshield of an aircraft, or windshield or window of an armored vehicle), thereby preventing or reducing the formation of condensation or ice, or evaporating or melting the condensation or ice that has already formed, on the transparency.

Figure 17:
FIG. 17 is a thermograph showing the heating pattern of a transparency according to an example embodiment of the present disclosure.

For example, the heating patterns of transparencies according to example embodiments of the present disclosure can be seen in the infrared thermograph shown in FIG. 17. The infrared thermograph was obtained using a thermal imaging camera that detects radiation in the infrared range of the electromagnetic spectrum and produces a thermal image of the windshield/window. The windshield/window was powered using 14/18 DC volts until the surface temperature of the windshield/window reached 100 to 150° F., and then the thermal image of the windshield/window was recorded. As can be seen in these infrared thermographs, the example transparencies exhibited excellent heating patterns that are suitable for defogging or de-icing the canopy, window, or windshield of an aircraft, despite the very low sheet resistance (e.g., about 0.02 to about 4 ohms/sq) of the conductive mesh. The heating patterns observed in FIG. 17 provide better results as compared to certain aircraft transparencies and armor-grade transparencies, in that the example transparencies exhibited more uniform heating as compared to certain existing transparencies.

Furthermore, the particular de-icing and/or defogging capabilities of an example transparency may be tailored to the particular application. Typically, an aircraft cockpit windshield requires greater de-icing capabilities than does an aircraft cockpit side window and, consequently, the aircraft cockpit windshield typically has a greater number of watts per square inch applied to it (e.g., about 4 to about 5 W/in. sq.) than does the aircraft cockpit side window (e.g., about 1 to about 2 W/in. sq.). As such, the de-icing and/or defogging capabilities of the transparency may be tailored to a particular application by appropriately selecting the sheet resistivity of the conductive mesh. Additionally, the transparency may include an electrical connection, such as bus bars, to accomplish the de-icing or defogging.

Although a transparency according to embodiments of the present disclosure may have de-icing or EMI shielding capabilities independently, the present inventors have also surprisingly discovered that a transparency according to embodiments of the present disclosure may have both de-icing and EMI shielding capabilities (e.g., capabilities that are beneficial for an aircraft transparency). The combination of de-icing and EMI shielding capabilities of a transparency according to embodiments of the present disclosure provide better results as compared to certain aircraft transparencies.

Figure 18:
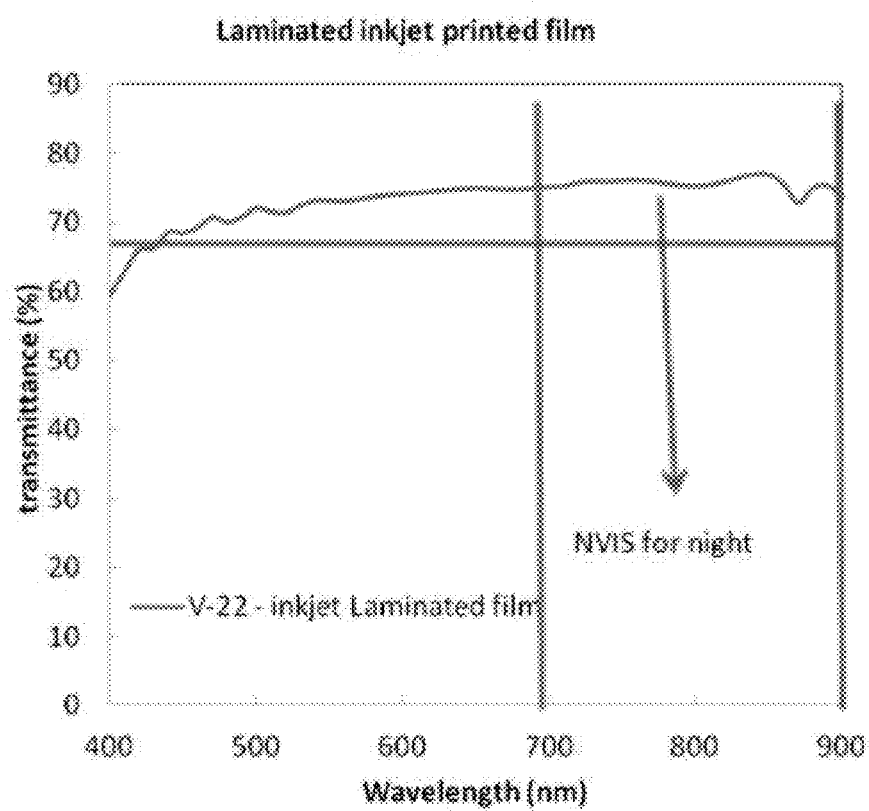
FIG. 18 is a graph showing light transmittance of an example transparency over a range of wavelengths of light.

In addition to de-icing and/or EMI shielding capabilities, a transparency according to embodiments of the present disclosure also has a very high visible light transmittance. For example, such a transparency may have a visible light transmittance of greater than 60%, greater than 65%, greater than 70%, or greater than 84%. As can be seen in the graph shown in FIG. 18, a transparency according to an example embodiment of the present disclosure has a high light transmittance in the visible light range (e.g., for wavelengths of about 400 nm to about 750 nm) as well as in the near infrared range (e.g., wavelengths of about 700 to about 900 nm). For example, the graph in FIG. 18 shows that a transparency according to an example embodiment of the present disclosure had a light transmittance of about 74% for wavelengths of about 700 to about 900 nm. The near infrared range is particularly useful for night vision applications that allow a user to see images using a broader spectrum of electromagnetic radiation than is observable with the naked eye by using an apparatus that converts near infrared light to visible light.

Additionally, embodiments of the present disclosure are directed to transparencies, such as smart windows or switchable windows that have variable light transmission properties. For example, embodiments of the present disclosure are directed to electrochromic devices, suspended particle devices, and liquid crystal devices. The above-described conductive mesh may be used as one or more of the transparent electrodes in any of the afore-mentioned devices. For example, the electrochromic device, suspended particle device, or liquid crystal device may include a transparent electrode including a conductive mesh formed by a plurality of electrically conductive lines, wherein at least one electrically conductive line intersects at least one other electrically conductive line. When used as a transparent electrode in these devices, the conductive mesh may be on a polymer film or it may be on a substrate, as described above with respect to the other embodiments of the disclosure. The operation or configuration of the conductive mesh is substantially the same as in the previous example embodiments and, therefore, further description thereof will not be provided.

Figure 19:
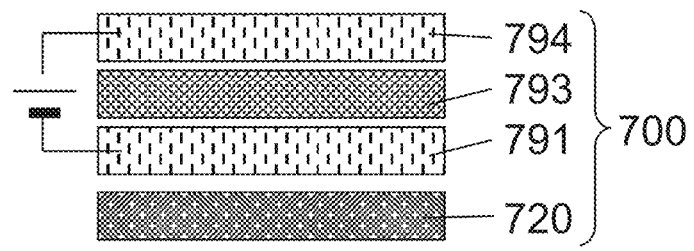
FIG. 19 is an exploded, cross-sectional view of a smart window according to an example embodiment of the disclosure.

In one embodiment, a smart window includes: a transparent substrate; a first transparent electrode on the transparent substrate; a transmittance controlling layer on the first transparent electrode, the transmittance controlling layer being capable of varying the light transmittance of the smart window; and a second transparent electrode on the transmittance controlling layer, wherein one of the first and second transparent electrodes includes a conductive mesh formed by a plurality of electrically conductive lines on the transparent substrate, wherein at least one electrically conductive line intersects at least one other electrically conductive line. FIG. 19 is an exploded, cross-sectional view of a smart window 700 including a conductive mesh according to an example embodiment of the disclosure. As can be seen in FIG. 19, the smart window includes a substrate 720, a first transparent electrode 791, a transmittance controlling layer 793, and a second electrode 794. Either or both of the first and second transparent electrodes 791 and 794, respectively, may include the conductive mesh. The substrate 720 may be any suitable substrate, including those substrates described with respect to the previous example embodiments. The transmittance controlling layer 793 may include any electrochromic material, suspended particles, or liquid crystals suitable for changing the transmittance of the smart window.

Figure 20:
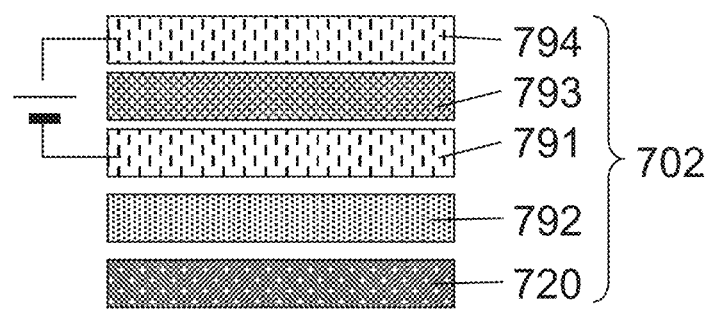
FIG. 20 is an exploded, cross-sectional view of a smart window according to another example embodiment of the disclosure.
Figure 21:
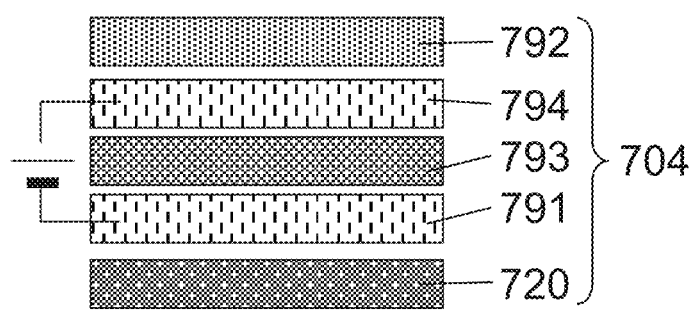
FIG. 21 is an exploded, cross-sectional view of a smart window according to another example embodiment of the disclosure.

In certain embodiments, the smart window also includes a polymer film. For example, FIG. 20 is an exploded, cross-sectional view of an example smart window 702 including a polymer film 792 between the substrate 720 and the first transparent electrode 791. Additionally, FIG. 21 is an exploded cross-sectional view of an example smart window 704 including a polymer film 792 on the second transparent electrode 794. The polymer film may be any suitable polymer film as described above. As described above, the conductive mesh may be formed (e.g., inkjet printed, aerosol jet printed, etc.) directly on the polymer film 792 or it may be formed (e.g., inkjet printed, aerosol jet printed, etc.) directly on the transparent substrate 720.

As a transparent electrode, the conductive mesh may provide an electrical signal to cause a change in the transparency and/or color of the device by causing a change in the electrochromic material, suspended particles, polymer, or liquid crystals of the transmittance controlling layer. The device may include any suitable electrochromic material, such as electrochromic polymers (e.g., polyaniline), viologens, polyoxotungstates, tungsten oxide, nickel oxide, and/or tungsten dioxide. Example electrochromic devices are described in more detail in U.S. Pat. No. 7,256,923, the entire contents of which are herein incorporated by reference. Additional example smart windows are described in more detail in Niklasson, G. A., and Granqvist, C. G., *Electrochromics for smart windows: thin films of tungsten oxide and nickel oxide, and devices based on these*, J. Mater. Chem., 17, 127-156 (2007), the entire contents of which are herein incorporated by reference.

Embodiments of the present disclosure also relate to sensors, for example, temperature sensors (e.g., microsensors), heating sensors, strain gauges, and any other sensor that includes lines in a pattern (e.g., lines that may be printed or otherwise deposited). Any of the materials, processes, and/or other features described herein may be utilized for the sensors. Embodiments of the sensors may be utilized separately from or together with the electrically conductive lines described herein.

Figure 22:
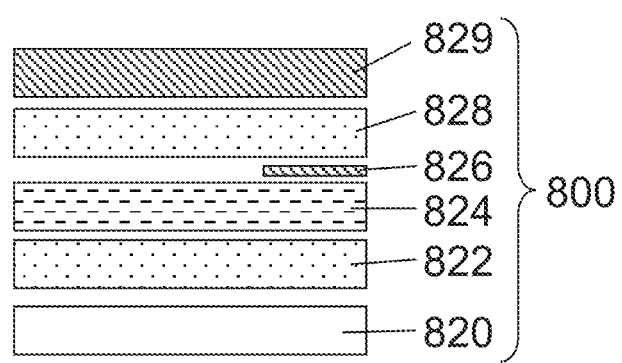
FIG. 22 is an exploded, cross-sectional view of a transparency according an embodiment of the disclosure.

FIG. 22 is a cross-sectional view of a transparency 800 including a heater film and a temperature sensor. The transparency 800 includes a basecoat 822 on a substrate 820. The substrate 820 and basecoat 822 may include any suitable materials available in the art for substrates and basecoats, respectively, and may be formed using any suitable method available in the art. The transparency further includes a heater film 824 on the basecoat 822. The heater film 824 may include any suitable material available in the art for heater films, and may be formed according to any suitable method available in the art. For example, the heater film may include an indium tin oxide (ITO) layer. In some embodiments, the heater film may include any of the electrically conductive lines described herein, and may be formed according to any of the methods described herein.

A sensor 826 may be on the heater film 824. The sensor 826 may include any of the electrically conductive lines described herein, and may be formed according to any of the methods described herein. As the temperature of the sensor increases (e.g., as a result of heat from the heater film 824), the resistance of the sensor 826 (e.g., the electrically conductive lines) increases. This increase in resistance may be detected by temperature control unit coupled to the sensor 826. The temperature control unit may control the temperature of the heater film. The temperature of the heater film may be more accurately monitored and controlled by utilizing embodiments of the sensor, as compared to other sensors that are not formed according to the embodiments disclosed herein, thereby improving the durability of the heater film and/or the transparency.

The transparency 800 may further include a dielectric layer between the sensor 826 (e.g., the electrically conductive lines) and the heater film 824. The dielectric layer may include any suitable dielectric material available in the art. The dielectric layer may be formed using any suitable method available in the art, and/or using any of the methods described herein (e.g., inkjet printing, aerosol jet processes, lithography, and/or the like). For example, the dielectric layer may include titanium oxide (e.g., $TiO_2$), aluminum oxide (e.g., $Al_2O_3$), dielectric aluminum zinc oxide (e.g., AZO), aluminum nitride (e.g., AlN), aluminum carbide (e.g., $Al_4C_3$), fused silica (e.g., $SiO_2$), magnesium oxide (e.g., MgO), indium tin oxide (e.g., ITO), boron nitride (e.g., BN), silicon carbide (e.g., CSi or SiC), zirconium dioxide (e.g., $ZrO_2$), diamond like carbon (e.g., DLC), hafnium oxide (e.g., $HfO_2$), and/or any other suitable metal oxide. The dielectric layer may be directly on the heater film 824 (e.g., the dielectric layer may physically contact the heater film 824) and the sensor 826 may be directly on the dielectric layer (e.g., the sensor 826 may physically contact the dielectric layer).

According to some embodiments, by having the dielectric layer directly contact (e.g., physically contact) the heater film 824 (and by having the sensor 826 directly or physically contact the dielectric film), the sensor 826 can detect smaller changes (and/or more accurately detect changes) in temperature (or other measured phenomena) of the heater film 824 than can a sensor having an additional layer (e.g., a urethane layer) between the sensor and the heater film. Thus, embodiments of the transparency including a dielectric layer directly contacting the heater film provide better detection of temperature changes in the heater film and provide better control of the temperature of the transparency than do transparencies that include an additional layer (e.g., urethane) between the sensor and the heater film. Because inaccurate and/or slow detection of temperature changes in the heater film can lead to overheating of the transparency, which may damage and/or degrade the transparency, embodiments of the present disclosure reduced the likelihood or amount of overheating of the transparency and thereby improve the stability and durability of the transparency.

A tiecoat 828 may be on the sensor 826 and the heater film 824. In some embodiments, the tiecoat 828 physically contacts both the heater film 824 and the sensor 826. The tiecoat 828 may include any suitable materials available in the art for tiecoats, and may be formed using any suitable method available in the art. The transparency 800 may further include a topcoat 829 on the tiecoat 828. The topcoat may include any suitable materials available in the art for topcoats, and may be formed using any suitable method available in the art.

Figure 23:
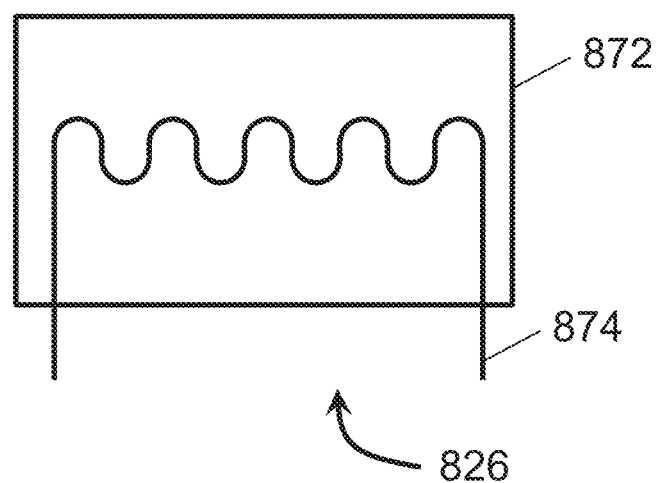
FIG. 23 is a top view of a sensor of an embodiment of the disclosure.

FIG. 23 is a top view of an embodiment of the sensor 826 of FIG. 22. As can be seen in FIG. 23, the sensor 826 may include a conductive line 874 (e.g., a resistor) on a dielectric layer 872. As noted above, the dielectric layer 872 may include any suitable dielectric material available in the art. The dielectric layer 872 may be formed using any suitable method available in the art, and/or using any of the methods described herein (e.g., photolithography, inkjet printing, aerosol jet processes, and/or the like). The dielectric layer 872 may directly contact (e.g., physically contact) the heater film 824. The conductive line 874 may include any suitable material available in the art for sensors, and may be formed using any suitable method available in the art. The conductive line 874 may include a plurality of lines. In some embodiments, the conductive line 874 includes the electrically conductive lines described herein, which may be formed according to any of the methods described herein.

Because the dielectric layer 872 may be formed according to the methods described herein (e.g., photolithography, inkjet printing, aerosol jet deposition, and/or the like), the dielectric layer 872 may be formed to be thin (e.g., the dielectric layer may have a thickness of 4 to 5 μm). Because the dielectric layer 872 may be formed to be thin, the conductive line 874 may be in close proximity to the heater film 824 (e.g., within a distance of 5 μm or less), and therefore, the transparency 800 may provide better detection of temperature changes in the heater film and provide better control of the temperature of the transparency than do transparencies that include a conductive line of a sensor that is further away from the heater film. Because inaccurate and/or slow detection of temperature changes in the heater film can lead to overheating of the transparency, which may damage and/or degrade the transparency, embodiments of the present disclosure reduced the likelihood or amount of overheating of the transparency and thereby improve the stability and durability of the transparency.

Figure 24:
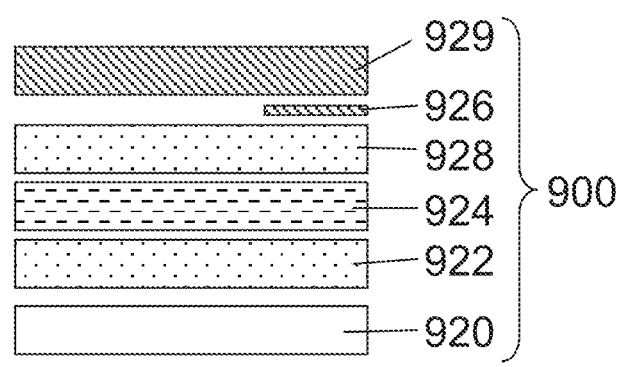
FIG. 24 is an exploded, cross-sectional view of a transparency according an embodiment of the disclosure.

Although FIG. 22 shows the sensor directly on the heater film, the present disclosure is not limited thereto. According to embodiments of the present disclosure, the heater film and/or sensor may be located on any suitable surface of the transparency. For example, FIG. 24 is a cross-sectional view of an embodiment of a transparency 900 including a substrate 920, a basecoat 922 on the substrate 920, a heater film 924 on the basecoat 922, a tiecoat 928 on the heater film 924, a sensor 926 on the tiecoat 928, and a topcoat 929 on the sensor 926. The features of the transparency 900 of FIG. 24 are otherwise substantially the same as the corresponding features of the transparency 800 FIG. 22, and thus, repeated explanation thereof is not necessary.

According to embodiments of the present disclosure, the electrically conductive lines may be formed using photomasks having curved sides and that form a hexagonal shape, and/or photomasks having sawtoothed (e.g., jagged) sides and that form a hexagonal shape.

Figure 25:
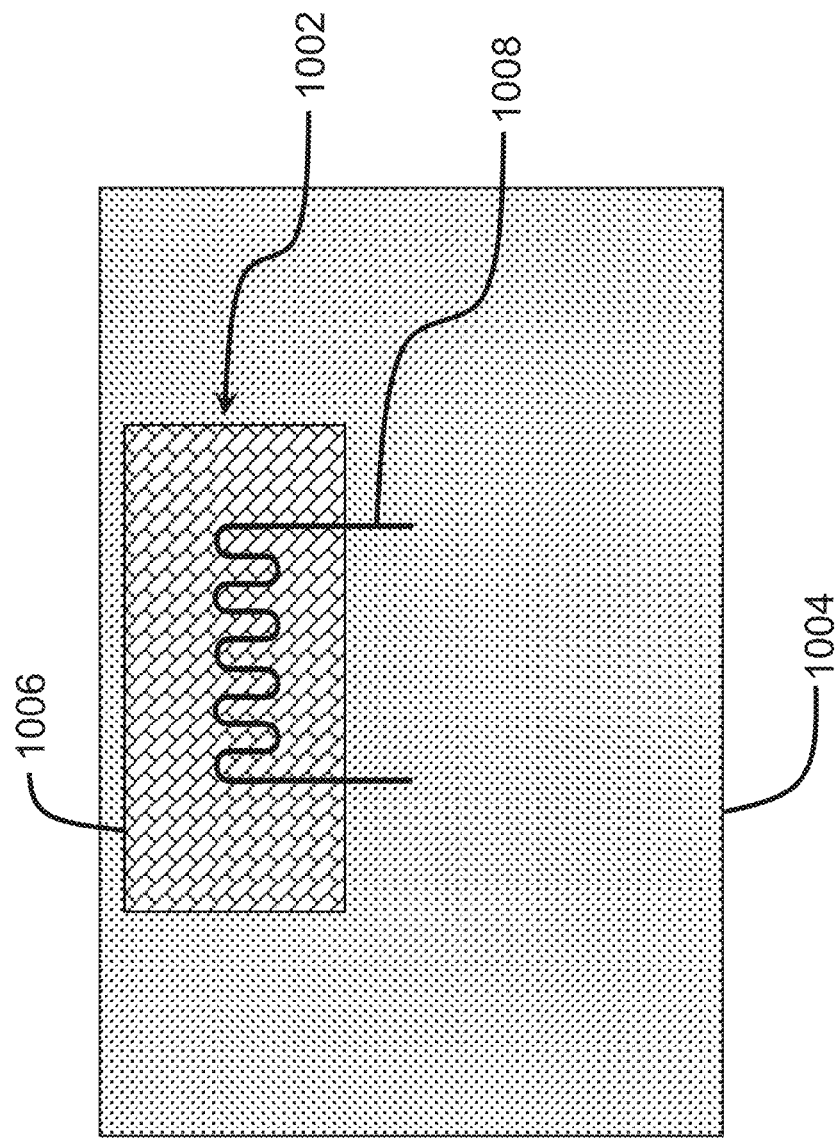
FIG. 25 is a top view of a transparency including a sensor according to an embodiment of the disclosure.

FIG. 25 is a top view of an embodiment of a sensor 1002 on a conductive layer 1004. The conductive layer 1004 may be transparent or non-transparent (e.g., opaque) and may include any suitable conductive material (e.g., a conductive metal oxide, such as ITO). In some embodiments, the conductive layer 1004 may be a transparent or non-transparent heater film (e.g., highly electrically conductive transparent or non-transparent lines). A transparent or non-transparent dielectric film 1006 on the conductive layer 1004.

Figure 26:
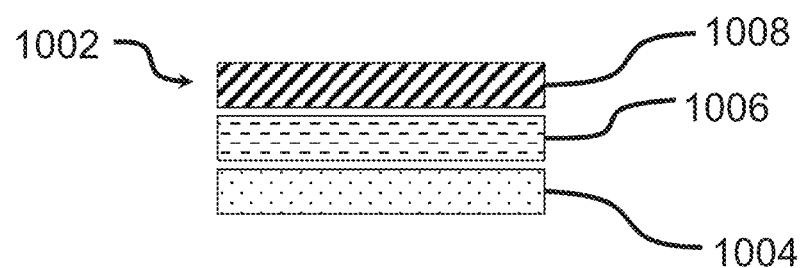
FIG. 26 is a top view of a transparency including a sensor according to an embodiment of the disclosure.
Figure 27:
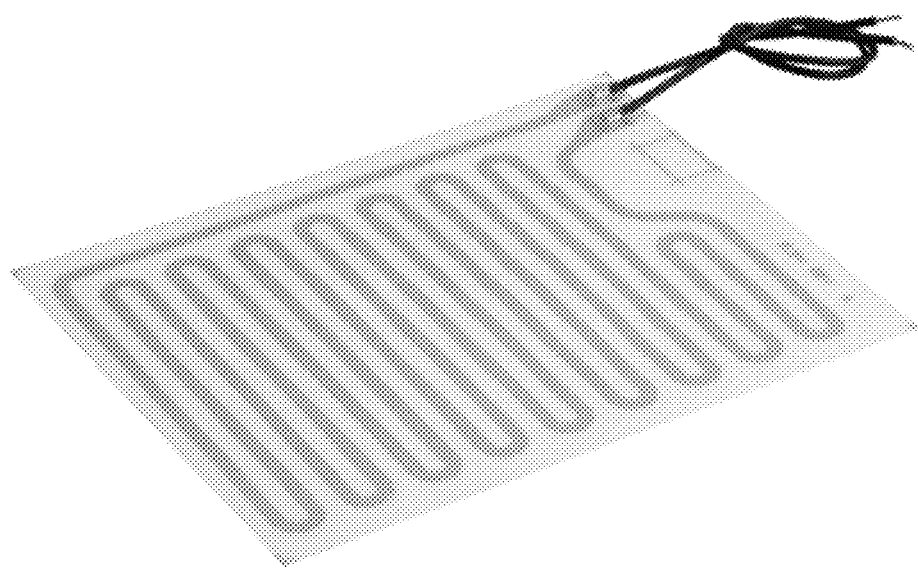
FIG. 27 is a perspective view of a sensor according to an embodiment of the present disclosure.

The transparent or non-transparent dielectric film 1006 may include any suitable dielectric material prepared utilizing any suitable process, such as those disclosed herein. The sensor includes a resistor 1008 (e.g., a transparent or non-transparent and high resistance electrically conductive line). The resistor 1008 may be any suitable resistor, such as the electrically conductive lines disclosed herein. FIG. 26 is a cross-sectional view of the sensor 1002 of FIG. 25 on the conductive layer 1004 (e.g., a transparent or non-transparent heater film). As can be seen in FIG. 26, the dielectric film 1006 (e.g., a transparent or non-transparent dielectric film) is on the conductive layer 1004 (e.g., the transparent or non-transparent heater film). The sensor 1002 includes the resistor 1008 (e.g., a high resistance transparent or non-transparent electrically conductive line on the dielectric film 1006). FIG. 27 is a perspective view of a sensor according to an embodiment of the present disclosure.

According to embodiments of the present disclosure, all features of the transparency may be printed and/or deposited according to the methods described herein. For example, in addition to the features described above, various electrical connections (e.g., bus bars connected to the heater film) may be formed by inkjet printing, aerosol jet deposition, and/or the like.

EMI shielding test results were evaluated on an example including electrically conductive lines having a width of 6 μm and a spacing between electrically conductive lines of 38 μm.

Hexagonal shaped conductive grids having various grid widths were evaporated onto polycarbonate substrates utilizing a photolithography process. The process utilized the application of a thin copper film layer deposited onto the polycarbonate substrates utilizing a thermal evaporation technique. In the thermal evaporation process, two small pieces of copper wire each having a length of 1 inch were placed inside a thermal evaporation boat. 12 thermal evaporation boats each separated by a distance of 6 inches were utilized. The polycarbonate substrates having dimensions of 12 inches by 12 inches and having a polysiloxane basecoat were loaded into the vacuum chamber, and the chamber was pumped down to a base pressure of about $10^{-6}$ torr. The copper was evaporated onto the substrates utilizing a voltage of about 450 to 500 volts for about 60 seconds. The chamber was then vented and the substrates were removed. The substrates were examined for the presence of any defects such as pin holes and/or copper balls on the copper film. The substrates were flow coated with AZ-P4210 photoresist (available from AZ Electronic Materials, Luxembourg or Integrated Micro Materials, Argyle, Tex.) in a clean room and air dried for 1 hour. The flow coated substrates were thermally cured at 200° F. for 30 minutes utilizing a heating oven. A positive photomask was placed on each substrate coated with the photoresist and sealed in a vacuum bag and pumped down to a pressure of 28 psi for 40 minutes to reduce or avoid any air gaps between the photomask and the photoresist. The vacuum bagged substrate was exposed to UV light for 1 to 2 minutes. The substrate was then removed from the vacuum bag and placed in a developer tank. 1,000 mL of Photoresist Developer AZ-340 (available from AZ Electronic Materials, Luxembourg or Integrated Micro Materials, Argyle, Tex.) was utilized with 5,000 mL of water. The substrates were then placed in an etching tank where about 15 g of ammonium peroxydisulfate dissolved in 3 gallons of hot water was utilized to etch the exposed copper. The process was carried out for about 5 minutes. The substrates were then placed in the remover tank where about 200 g of sodium hydroxide dissolved in 3 gallons of water was utilized to remove the unexposed photoresist. This process was carried out for about 2 minutes and resulted in a conductive copper grid patterned on the substrate. The EMI shielding measurements were carried out in Stork Garwood Materials Technology Laboratories at Pico Rivera, Calif. utilizing a Hewlett Packard 8720 C network analyzer tool. During the EMI measurement, the transmitter was at one side of the substrate and receiver antennas were placed at the opposite sides of the substrate, thereby aligning the transmitter and receiver. The antennas had a size of 1 inch×½ inch. The shielding effectiveness was measured at frequencies between 8-12 GHz and 12-18 GHz.

The results of the EMI shielding evaluation and visible light transmittance for substrates having a grid having widths of 38 μm and 7 μm, respectively, are as follows.

| Grid width (μm) | Grid pitch (μm) | VLT (%) | EMI shielding effectiveness (dB) at 8-12 GHz | EMI shielding effectiveness (dB) at 12-18 GHz |
|---|---|---|---|---|
| 7 | 270 | 85 | 25.6 | 20.7 |
| 38 | 237 | 64.7 | 29.6 | 24.4 |

Although the process described above utilizes a positive photomask, the present disclosure is not limited thereto. For example, the electrically conductive lines may be prepared utilizing a negative photomask according to any suitable method available in the art. In utilizing the negative photomask, the transparency may be immersed in a nickel tank to cover portions of the copper with nickel to prevent those portions of the copper from being etched.

Figure 31:
FIG. 31 is an image of light passing through an embodiment of a transparency including the electrically conductive lines shown in FIGS. 28-30.

Electrically conductive lines having apertures having three-fold symmetry were prepared by way of lithography (i.e., photolithography). The substrates were flow coated with AZ-P4210 photoresist (available from AZ Electronic Materials, Luxembourg or Integrated Micro Materials, Argyle, Tex.) in a clean room and air dried for 1 hour. The flow coated substrates were thermally cured at 200° F. for 30 minutes utilizing a heating oven. A positive photomask was placed on each substrate coated with the photoresist and sealed in a vacuum bag and pumped down to a pressure of 28 psi for 40 minutes to reduce or avoid any air gaps between the photomask and the photoresist. The vacuum bagged substrate was exposed to UV light for 1 to 2 minutes. The substrate was then removed from the vacuum bag and placed in a developer tank. 1,000 mL of Photoresist Developer AZ-340 (available from AZ Electronic Materials, Luxembourg or Integrated Micro Materials, Argyle, Tex.) was utilized with 5,000 mL of water. The substrates were then placed in an etching tank where about 15 g of ammonium peroxydisulfate dissolved in 3 gallons of hot water was utilized to etch the exposed copper. The process was carried out for about 5 minutes. The substrates were then placed in the remover tank where about 200 g of sodium hydroxide dissolved in 3 gallons of water was utilized to remove the unexposed photoresist. Finally the substrate was cleaned with deionized water and dried with nitrogen. SEM images of the electrically conductive lines having three-fold symmetry are shown in FIGS. 28-30. FIGS. 28 and 29 show electrically conductive lines having intersections having a rounded shape. The SEM image shown in FIG. 28 was obtained using the following values: SEM HV: 15.00 kV; WD: 42.85 mm; View field: 1.23 mm; Det: SE Detector. The SEM image shown in FIG. 29 was obtained using the following values: SEM HV: 15.00 kV; WD: 42.85 mm; View field: 406.5 μm; Det: SE Detector. The SEM image shown in FIG. 30 was obtained using the following values: SEM HV: 15.00 kV; WD: 42.66 mm; View field: 72.54 μm; Det: SE Detector. As can be seen in FIG. 30, the electrically conductive lines had widths of 9.91 μm (D1), 9.80 μm (D2), and 10.31 μm (D3). As such, the grid had widths of 9 to 10 μm. Additionally, the grid of FIGS. 28-30 had a pitch of 270 μm. The SEM images of FIGS. 28-30 illustrate the grid shape, width, and pitch of the grid. A light was shone through the transparency by placing the transparency substantially orthogonally to an intense beam of light and the image was collected utilizing a camera. FIG. 31 is an image showing the light shining through the transparency. As can be seen in FIG. 31, no or substantially no X-shaped Fraunhofer diffraction is observed when viewing the point source of light through the substrate including the electrically conductive lines shown in FIGS. 28-30. A portion of the electrically conductive lines of the transparency were broken, and thus, in FIG. 31 a portion of the transparency appears to be darkened or spotted. Additionally, the light transmittance (LT) and haze (H) of the transparency were measured as follows. A 12" inch by 12" inch coupon of the transparency was tested according to ASTM D1003 using a Haze-Gard Plus instrument. Haze measures the clearness and transparency of the film (the film should not be translucent and diffuse light), while the luminous or visible light transmittance indicates the amount of visible light transmitted through the sample. The transparency including the electrically conductive lines shown in FIGS. 28-30 exhibited a light transmittance of 77.4% and a haze of 2.60%.

As can be seen in FIGS. 28 and 29, the electrically conductive lines define an array of regular polygons (hexagons) in which each of the straight sides of the regular polygon have been replaced with a single (e.g., sole) curved line having a single (e.g., sole) curvature. As such, in the embodiment shown in FIGS. 28 and 29, the electrically conductive lines define an aperture having a shape of a polygon having at least one curved side. Further, as can be seen in FIGS. 28 and 29 the curved side has a radius of curvature of no more than 500 μm. In FIGS. 28 and 29, the curved side has a shape of approximately a semicircle. The electrically conductive lines of embodiments that define an aperture having a shape of a polygon having at least one curved side having a radius of curvature of no more than 500 μm (e.g., the electrically conductive lines that define an aperture having a shape of a polygon in which each of the straight sides has been replaced with a single curved line having a single curvature) may have substantially larger widths than the electrically conductive lines of other embodiments, and the resultant transparency may still provide suitably reduced diffraction and distraction. In some embodiments, the electrically conductive lines may have a width as disclosed herein (e.g., a width of no more than 50 μm, or no more than 15 μm).

Figure 35:
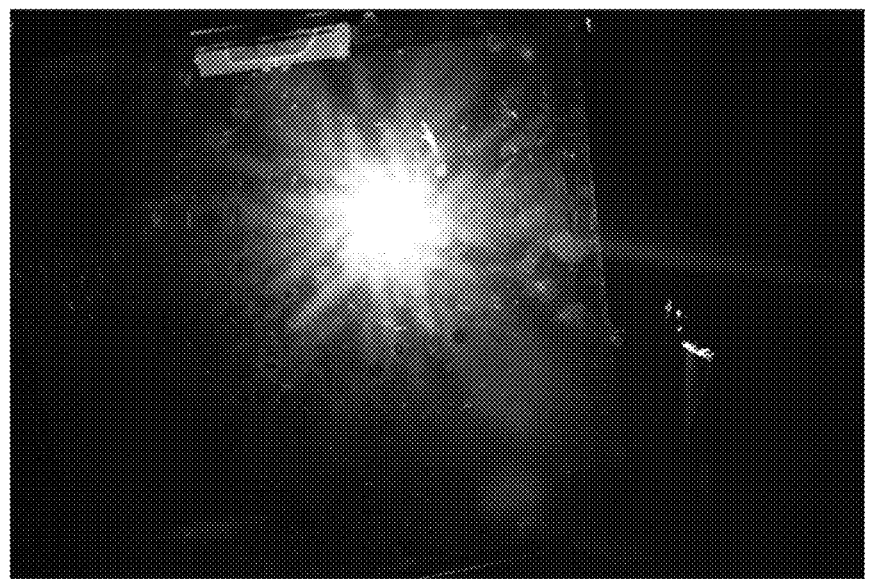
FIG. 35 is an image of light passing through an embodiment of a transparency including the electrically conductive lines shown in FIGS. 32-34.

Electrically conductive lines having hexagonal apertures were prepared by way of lithography (i.e., photolithography). The substrates were flow coated with AZ-P4210 photoresist (available from AZ Electronic Materials, Luxembourg or Integrated Micro Materials, Argyle, Tex.) in a clean room and air dried for 1 hour. The flow coated substrates were thermally cured at 200° F. for 30 minutes utilizing a heating oven. A positive photomask was placed on each substrate coated with the photoresist and sealed in a vacuum bag and pumped down to a pressure of 28 psi for 40 minutes to reduce or avoid any air gaps between the photomask and the photoresist. The vacuum bagged substrate was exposed to UV light for 1 to 2 minutes. The substrate was then removed from the vacuum bag and placed in a developer tank. 1,000 mL of Photoresist Developer AZ-340 (available from AZ Electronic Materials, Luxembourg or Integrated Micro Materials, Argyle, Tex.) was utilized with 5,000 mL of water. The substrates were then placed in an etching tank where about 15g of ammonium peroxydisulfate dissolved in 3 gallons of hot water was utilized to etch the exposed copper. The process was carried out for about 5 minutes. The substrates were then placed in the remover tank where about 200 g of sodium hydroxide dissolved in 3 gallons of water was utilized to remove the unexposed photoresist. Finally the substrate was cleaned with deionized water and dried with nitrogen. SEM images of the electrically conductive lines having hexagonal apertures are shown in FIGS. 32-34. As can be seen in FIGS. 32-34, the electrically conductive lines are sawtoothed (e.g., wavy) lines. The SEM image shown in FIG. 32 was obtained using the following values: SEM HV: 15.00 kV; WD: 33.47 mm; View field: 1.23 mm; Det: SE Detector. The SEM image shown in FIG. 33 was obtained using the following values: SEM HV: 15.00 kV; WD: 33.13 mm; View field: 591.4 µm; Det: SE Detector. The SEM image shown in FIG. 34 was obtained using the following values: SEM HV: 15.00 kV; WD: 33.47 mm; View field: 99.18 µm; Det: SE Detector. As can be seen in FIG. 34, the electrically conductive lines had widths of 16.66 µm (D1), and 17.04 µm (D2). As such, the grid had widths of about 17 µm. Additionally, as can be seen in FIG. 33, the apertures had a short side width (D1) of 221.41 µm and a long side width (D2) of 244.26 µm. The grid of FIGS. 32-34 had a pitch of 244 µm. The SEM images of FIGS. 32-34 illustrate the grid shape, width, and pitch of the grid. A light was shone through the transparency as described above with respect to FIG. 31. FIG. 35 is an image showing the light shining through the transparency. As can be seen in FIG. 35, no or substantially no X-shaped Fraunhofer diffraction is observed when viewing the point source of light (visible light) through the substrate including the electrically conductive lines shown in FIGS. 32-34. Additionally, the light transmittance (LT) and haze (H) of the transparency were measured as described above with respect to FIG. 31. The transparency including the electrically conductive lines shown in FIGS. 32-34 exhibited a light transmittance of 75.4% and a haze of 1.78%. Additionally, the EMI shielding of the transparency was measured as follows. A Hewlett-Packard (HP) network analyzer 8720C was used to measure the EMI shielding performance value. Each sample for measure of the EMI value was placed in between two horns each having a size of 1 inch by ½ inch. The network analyzer was at first calibrated using a substrate without a grid on the substrate, the substrate having substantially the same composition as those including the grid. The average of the EMI value was recorded between 8.2 to 12.4 GHz frequency or 12.4 to 18 GHz frequency. At frequencies of 8.2 to 12.4 GHz, the transparency exhibited an average EMI shielding of −27.70 dB. At frequencies of 12.4 to 18 GHz, the transparency exhibited an average EMI shielding of −21.65 dB.

As can be seen in FIGS. 32 and 33, the electrically conductive lines define an array of regular polygons (hexagons) in which each of the straight sides of the regular polygon have been replaced with a curved line having a plurality of curvatures. The electrically conductive lines of embodiments that define a polygon in which each of the straight sides has been replaced with a curved line having a plurality of curvatures.

As used herein, the term "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the present disclosure has been described in connection with certain example embodiments, it is to be understood that the disclosure is not limited to the disclosed embodiments, but, on the contrary, is intended to cover various modifications and equivalent arrangements included within the spirit and scope of the appended claims, and equivalents thereof.

What is claimed is:

1. A transparency comprising:
   a transparent substrate; and
   a plurality of electrically conductive lines on the transparent substrate, at least one of the electrically conductive lines intersecting at least one other electrically conductive line,
   wherein the plurality of electrically conductive lines define an aperture having a closed shape, and
   wherein at least one of the electrically conductive lines has undulations having peaks and troughs in a plane defined by the transparent substrate such that a distance between two adjacent peaks is no more than 30 µm.

2. The transparency of claim 1, wherein a distance between two of the electrically conductive lines is no more than 1 mm.

3. The transparency of claim 1, wherein the transparency provides electromagnetic interference shielding.

4. The transparency of claim 3, wherein the transparency further comprises a transparent conductive oxide on the substrate.

5. The transparency of claim 4, wherein the transparency provides EMI shielding at a frequency of 3 Hz to 300 kHz.

6. A transparency comprising:
   a transparent substrate; and
   a plurality of electrically conductive lines on the transparent substrate, the electrically conductive lines defining an aperture having a shape of a polygon having three curved sides, a first of the curved sides having a direction of curvature toward a center of the polygon, a second and third of the sides being adjacent to the first side and each having a direction of curvature away from the center of the polygon, and each of the curved sides having a radius of curvature of no more than 500 µm.

7. The transparency of claim 6, wherein each of the sides of the polygon is curved and has a radius of curvature of no more than 500 µm.

8. The transparency of claim 1, wherein the undulations have peaks and troughs such that a distance between two adjacent peaks is no more than 20 µm.

9. The transparency of claim 1, further comprising:
a dielectric layer on the substrate; and
a sensor comprising a conductive layer on the dielectric layer, wherein at least one layer selected from the dielectric layer and the conductive layer is formed by at least one method selected from lithography, inkjet printing, and aerosol jet printing.

10. The transparency of claim 9, wherein a heater layer is between the substrate and the sensor.

11. The transparency of claim 10, wherein the heater layer comprises the plurality of electrically conductive lines.

12. The transparency of claim 9, wherein the sensor is selected from a temperature sensor, a crack detector, an arc detector, a strain gauge, and a moisture sensor.

13. A vehicle comprising the transparency of claim 1.

14. The vehicle of claim 13, wherein the vehicle is a flying vehicle.

15. The vehicle of claim 13, wherein the vehicle is a ground vehicle.

16. A smart window comprising the transparency of claim 1.

17. A coated substrate comprising:
a substrate;
a heater layer on the substrate;
a dielectric layer directly on the heater layer; and
a sensor comprising a conductive layer on the heater layer and directly on the dielectric layer, wherein at least one layer selected from the dielectric layer and the conductive layer is formed by at least one method selected from lithography, inkjet printing, and aerosol jet printing.

18. The transparency of claim 1, wherein at least one of the electrically conductive lines has a width of no more than 50 µm.

19. The coated substrate of claim 17, wherein the sensor is selected from a temperature sensor, a crack detector, an arc detector, a strain gauge, and a moisture sensor.

20. A vehicle comprising the coated substrate of claim 17.

* * * * *